(12) United States Patent
Matsuura

(10) Patent No.: US 10,147,810 B2
(45) Date of Patent: Dec. 4, 2018

(54) SEMICONDUCTOR DEVICE AND METHOD OF MANUFACTURING SAME

(71) Applicant: RENESAS ELECTRONICS CORPORATION, Tokyo (JP)

(72) Inventor: Hitoshi Matsuura, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/906,889

(22) Filed: Feb. 27, 2018

(65) Prior Publication Data

US 2018/0190806 A1 Jul. 5, 2018

Related U.S. Application Data

(62) Division of application No. 15/180,988, filed on Jun. 13, 2016, now Pat. No. 9,941,396.

(30) Foreign Application Priority Data

Aug. 21, 2015 (JP) .................................. 2015-163357

(51) Int. Cl.
| | | |
|---|---|---|
| H01L 29/739 | (2006.01) | |
| H01L 29/10 | (2006.01) | |
| H01L 21/265 | (2006.01) | |
| H01L 29/06 | (2006.01) | |

(Continued)

(52) U.S. Cl.
CPC ...... *H01L 29/7397* (2013.01); *H01L 29/0619* (2013.01); *H01L 29/0696* (2013.01);
(Continued)

(58) Field of Classification Search
CPC ............. H01L 29/7397; H01L 29/1095; H01L 29/0696; H01L 29/0834; H01L 29/7395;
(Continued)

(56) References Cited

U.S. PATENT DOCUMENTS 7,923,772 B2 * 4/2011 Mauder ............... H01L 29/7813
257/330
9,041,050 B2 5/2015 Matsuura
(Continued)

FOREIGN PATENT DOCUMENTS

JP 2013-140885 A 7/2013

OTHER PUBLICATIONS

Non-Final Office Action issued in corresponding parent U.S. Appl. No. 15/180,988, dated May 26, 2017.
(Continued)

*Primary Examiner* — Jonathan Han
(74) *Attorney, Agent, or Firm* — McDermott Will & Emery LLP

(57) ABSTRACT

To achieve a semiconductor device equipped with a low ON voltage and high load short circuit withstand trench gate IGBT. A collector region on a back surface of a semiconductor substrate is comprised of a relatively lightly-doped $P^+$ type first collector region and a relatively heavily-doped $P^{++}$ type second collector region. The $P^{++}$ type second collector region includes, in plan view, interfaces between a first trench having therein a first linear trench gate electrode and an $N^+$ type emitter region formed on the side surface of the first trench and between a second trench having therein a second linear trench gate electrode and an $N^+$ type emitter region formed on the side surface of the second trench. This enables electrons injected from the surface side of the semiconductor substrate to reach the $P^{++}$ type second collector region and offset, with them, holes injected from the back surface side of the semiconductor substrate.

4 Claims, 30 Drawing Sheets

(51) Int. Cl.
  *H01L 29/40* (2006.01)
  *H01L 29/66* (2006.01)
  *H01L 29/423* (2006.01)
  *H01L 29/08* (2006.01)

(52) U.S. Cl.
  CPC ...... *H01L 29/0834* (2013.01); *H01L 29/1095* (2013.01); *H01L 29/404* (2013.01); *H01L 29/407* (2013.01); *H01L 29/4238* (2013.01); *H01L 29/66348* (2013.01)

(58) Field of Classification Search
  CPC .......................... H01L 29/861; H01L 29/407; H01L 29/66348
  USPC .......... 257/262, 368–401, E29.255–E29.313, 257/E29.315–E29.316, 139, 140, 278; 438/138, 270
  See application file for complete search history.

(56) References Cited

U.S. PATENT DOCUMENTS

| | | |
|---|---|---|
| 2012/0181575 A1 | 7/2012 | Pfirsch |
| 2012/0292662 A1 | 11/2012 | Matsuura et al. |
| 2012/0313139 A1* | 12/2012 | Matsuura ................ H01L 29/36 257/139 |
| 2014/0334212 A1* | 11/2014 | Hashimoto ......... H01L 27/0727 363/131 |
| 2015/0236143 A1* | 8/2015 | Pfirsch ................. H01L 21/266 257/133 |

OTHER PUBLICATIONS

Notice of Allowance and Allowability issued in corresponding parent U.S. Appl. No. 15/180,988, dated Dec. 13, 2017.

* cited by examiner

SEMICONDUCTOR DEVICE AND METHOD OF MANUFACTURING SAME

CROSS-REFERENCE TO RELATED APPLICATIONS

The application is a divisional of U.S. application Ser. No. 15/180,988 filed on Jun. 13, 2016, which claims benefit of Japanese Patent Application No. 2015-163357 filed on Aug. 21, 2015 including the specification, drawings, and abstract is incorporated herein by reference in their entirety.

BACKGROUND

The present invention relates to a semiconductor device and a method of manufacturing same, which are suited for use in, for example, a semiconductor device equipped with a trench gate IGBT (insulated gate bipolar transistor).

For example, Japanese Unexamined Patent Application Publication No. 2013-140885 (Patent Document 1) discloses an IE (injection enhancement) type trench gate IGBT having a cell formation region comprised essentially of a first linear unit cell region having a linear active cell region, a second linear unit cell region having a linear hole collector cell region, and a linear inactive cell region therebetween.

Patent Document

[Patent Document 1] Japanese Unexamined Patent Application Publication No. 2013-140885

SUMMARY

It is important to design a trench gate IGBT so as not to allow passage of a collector current equal to or greater than a required amount in order to ensure load short circuit withstand due to the Kirk effect. Reduction in the collector current, however, leads to such a problem as increases in ON voltage. The load short circuit withstand can be ensured by increasing the concentration of the collector region, but it deteriorates switching-off loss performance. There is accordingly a demand for the development of a semiconductor device equipped with a trench gate IGBT capable of overcoming these problems.

Another problem and a novel feature will be apparent from the description herein and accompanying drawings.

A semiconductor device according to one embodiment has a collector region on the back surface of a semiconductor substrate. The collector region is comprised of a relatively lightly-doped $P^+$ type first collector region and a relatively heavily doped $P^{++}$ type second collector region. The $P^{++}$ type second collector region includes, in plan view, an interface between a trench having therein a linear trench gate electrode to be electrically coupled to a gate electrode and an $N^+$ type emitter region famed on the side surface of the trench.

A method of manufacturing a semiconductor device according to the one embodiment includes the following steps. First, after formation of a first trench and a second trench with a space therebetween from the surface of a semiconductor substrate having therein an $N^-$ type drift region, a first linear trench gate electrode is famed in the first trench via a first gate insulating film and a second linear trench gate electrode is formed in the second trench via a second gate insulating film. Then, a P type body layer is formed on the surface side of the semiconductor substrate and an $N^+$ type emitter region is formed on the surface side of the semiconductor substrate in the P type body layer so as to be contiguous to the side surface of the first trench. Then, after formation of an interlayer insulating film on the surface of the semiconductor substrate, a gate electrode to be electrically coupled to the first linear trench gate electrode and an emitter electrode to be electrically coupled to the second linear trench gate electrode, the P type body layer, and the $N^+$ type emitter region are formed on the interlayer insulating film. After grinding the semiconductor substrate from the back surface side thereof into a desired thickness, a P type impurity is ion-implanted into the back surface side of the semiconductor substrate to form a $P^+$ type first collector region. Then, after patterning of a resist film formed by application on the back surface of the semiconductor substrate, a P type impurity is ion-implanted into the back surface side of the semiconductor substrate with the patterned resist film as a mask to form a $P^{++}$ type second collector region. Then, a collector electrode to be electrically coupled to the $P^+$ type first collector region and the $P^{++}$ type second collector region is formed on the back surface of the semiconductor substrate. The $P^{++}$ type second collector region includes, in plan view, an interface between the first trench and the $N^+$ type emitter region.

According to the embodiment, a semiconductor device equipped with a trench gate IGBT having a low ON voltage and at the same time, high load short circuit withstand can be achieved.

DETAILED DESCRIPTION

Figure 1:
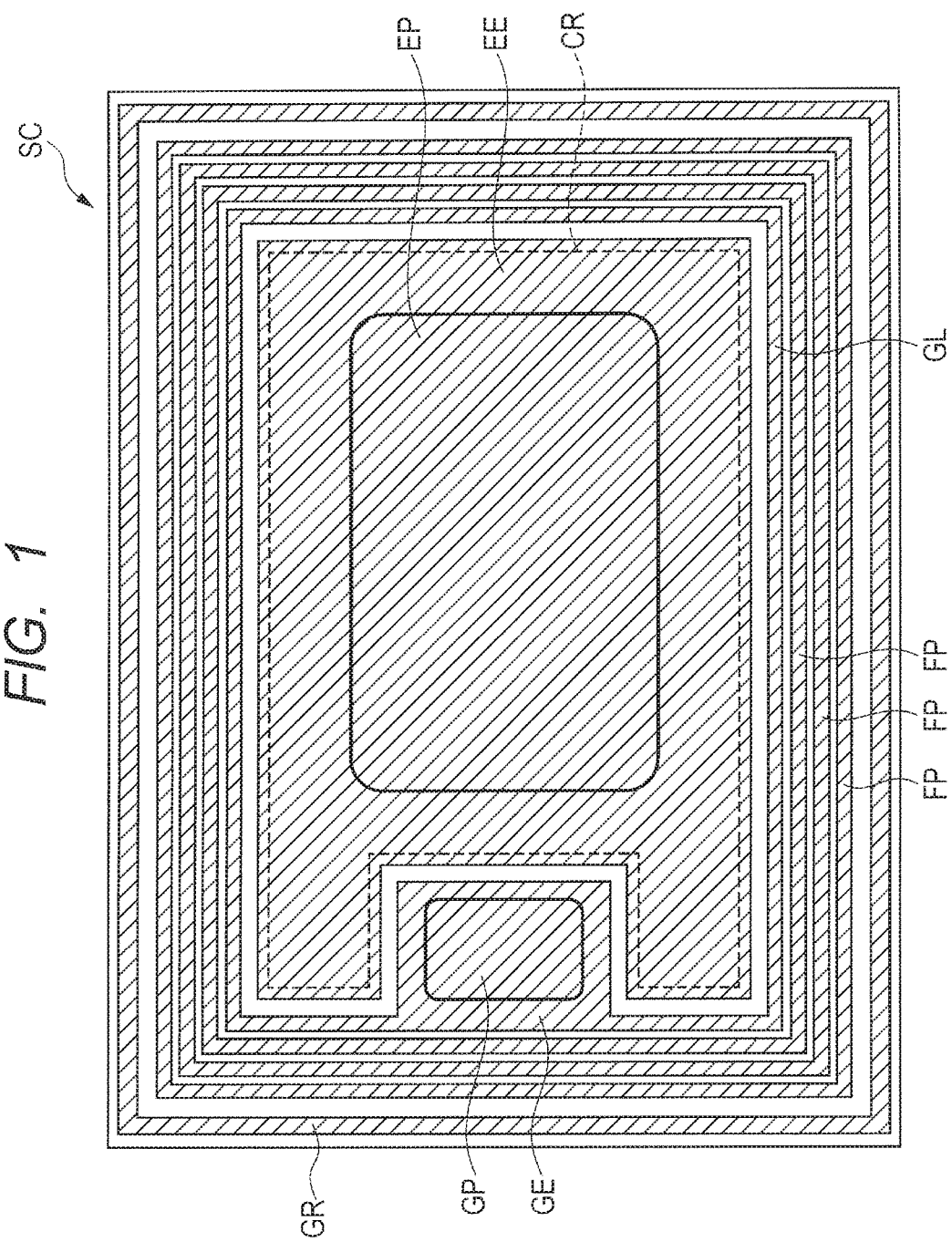
FIG. 1 is a fragmentary plan view of a semiconductor device (semiconductor chip) equipped with a trench gate IGBT according to First Embodiment.

In the following embodiments, a description will be made after divided into a plurality of sections or embodiments if necessary for the sake of convenience. These sections or embodiments are not independent from each other unless otherwise particularly specified, but one of them may be a modification example, application example, detailed description, complementary description, or the like of a part or whole of the other one. In the following embodiments, when a reference is made to the number (including the number, value, amount, range, or the like) of a component, the number is not limited to a specific number but may be more or less than the specific number, unless otherwise particularly specified or principally apparent that the number is limited to the specific number.

Further, in the following embodiments, the constituent component (including component step or the like) is not always essential unless otherwise particularly specified or principally apparent that it is essential. Similarly, in the following embodiments, when a reference is made to the shape, positional relationship, or the like of the constituent component, that substantially approximate or analogous to it is also embraced unless otherwise particularly specified or principally apparent that it is not. This also applies to the above-described number (including number, value, amount, range, or the like).

Embodiments will hereinafter be described in detail based on drawings. In all the drawings for describing the embodiment, members having the same function will be identified by the same or related reference numerals and overlapping descriptions will be omitted. When there are two or more members (sites) similar to each other, a symbol may be added to a generic reference numeral to show an individual or specific site. In the following embodiments, any description on the same or similar portion will not be repeated in principle unless otherwise particularly necessary.

In the drawings used in the embodiments, even cross-sectional views are sometimes not hatched in order to facilitate understanding of them. On the other hand, even plan views are sometimes hatched to facilitate understanding of them.

In the cross-sectional or plan view, the size of each site does not correspond to that of an actual device. To facilitate understanding of the drawing, a specific site may be shown in a relatively large size. Even when a cross-sectional view and a plan view correspond to each other, the size of a specific site may be relatively increased in order to facilitate understanding of the drawing.

Problems of an IGBT found by the present inventors will next be described in order to clearly show the semiconductor device of the present embodiments.

Problem (1)

Figure 30:
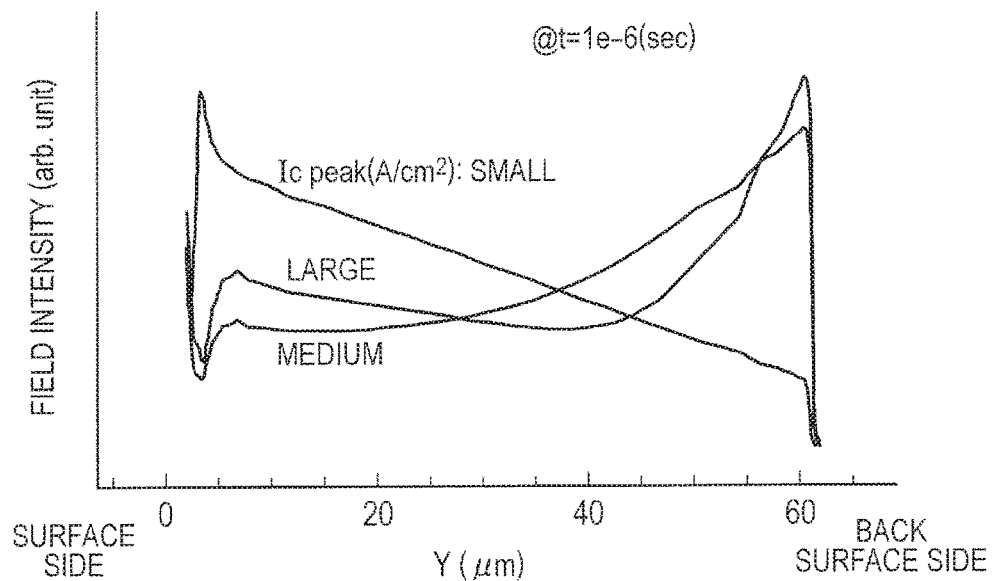
FIG. 30 is a graph showing a field intensity distribution during the load short-circuit of an IGBT, using a collector current density as a parameter.

When an ON signal is input into an IGBT during load short-circuit, there is a risk of the IGBT being broken down because due to a power supply voltage between a collector and an emitter, the current maximum for the IGBT is applied. Particularly, when the field intensity on the back surface side of the substrate of the IGBT increases due to a Kirk effect, the field intensity exceeds the critical field intensity, avalanche breakdown occurs, and a great number of carriers are generated on the back surface side of the substrate. This phenomenon is likely to lead to marked occurrence of a collector current density (refer to FIG. 30). When a parasitic bipolar transistor on the back surface of the substrate is turned ON, the IGBT is broken down by latch-up. The Kirk effect is an effective base width increasing phenomenon that occurs because an injection level becomes high with an increase in collector current in a bipolar transistor and a base-collector depletion layer is therefore pushed to the collector side. It is also called "base pushout effect (kirk effect)"

It is therefore important to design the transistor so as to prevent application of an excess amount of a collector current in order to ensure load short circuit withstand.

Figure 31:
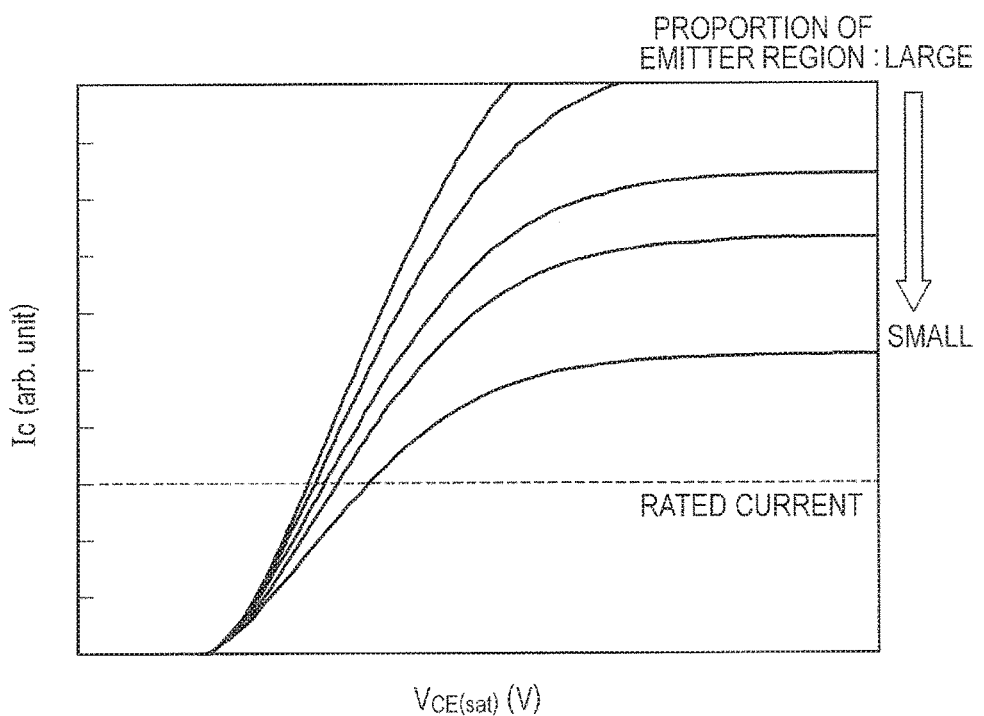
FIG. 31 is a graph showing the relationship of IGBT between a collector current (Ic) and ON voltage ($V_{CE(sat)}$), using a proportion of an emitter region per unit area as a parameter.

Reduction in collector current, however, causes such a problem as an increase in ON voltage (refer to FIG. 31). The term "ON voltage" means a collector voltage (also called "saturation voltage") necessary for sending a rated current while applying a gate voltage. In order to decrease the ON voltage as much as possible, an increase in collector current is desired so that there is a trade-off relationship between load short circuit withstand and ON voltage. This means that in order to reduce the ON voltage, an increase in collector current is desired, but in order to increase the load short circuit withstand, a decrease in collector current is desired.
Problem (2)

Figure 32:
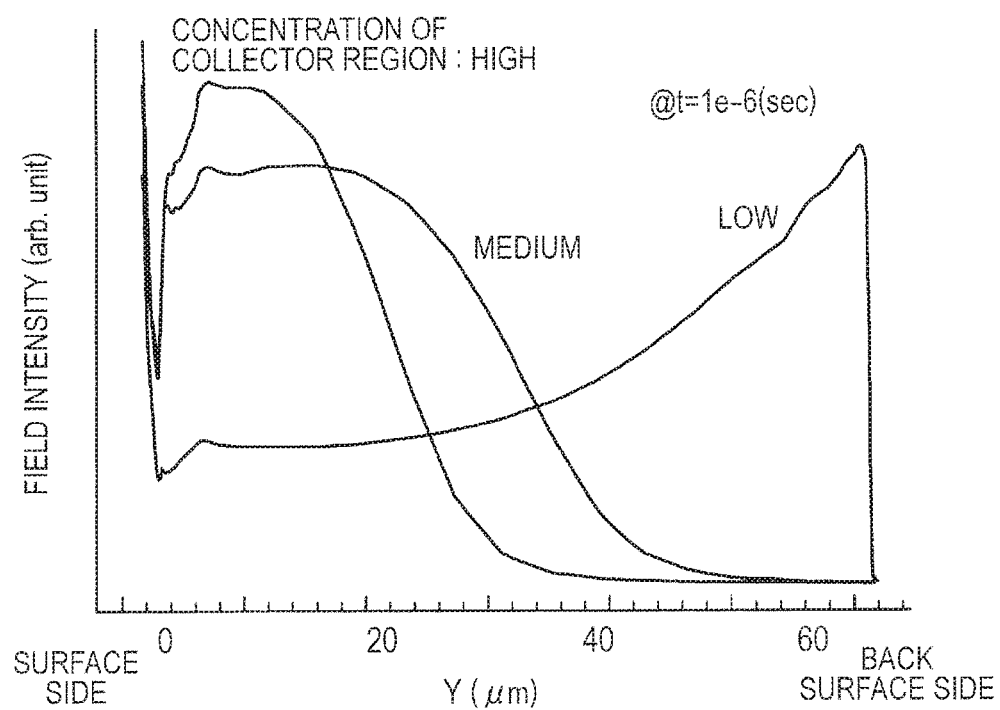
FIG. 32 is a graph showing a field intensity distribution during the load short circuit of an IGBT, using the concentration of a collector region as a parameter.
Figure 33:
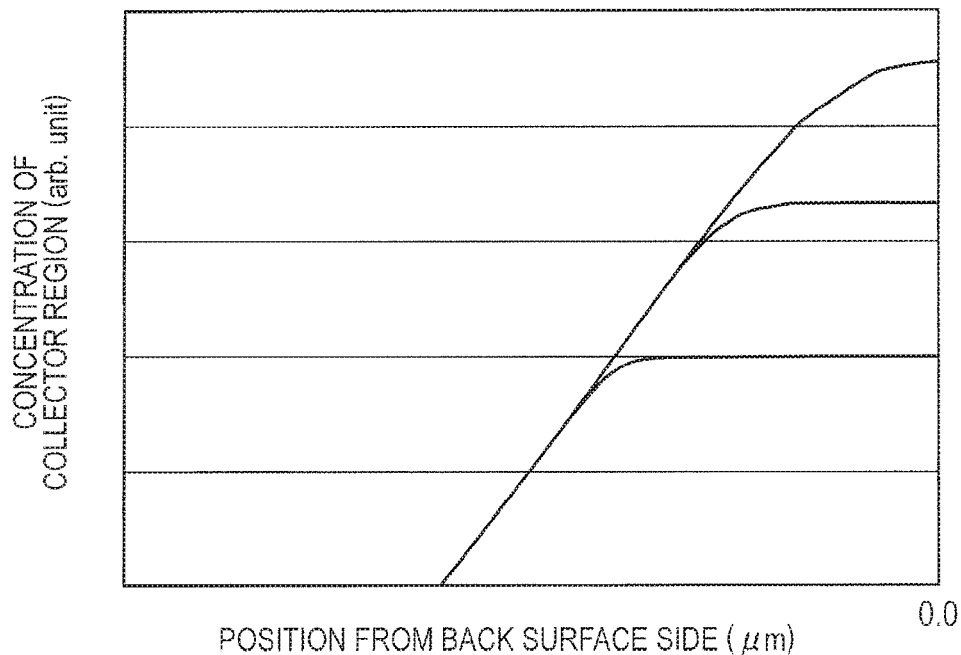
FIG. 33 is a graph showing a concentration distribution of the collector region of an IGBT, using the concentration of the collector region as a parameter.

The Kirk effect can be suppressed by increasing the amount of holes supplied from a PN diode on the back surface side of the substrate to offset electrons and separating the peak position of the field intensity from the PN diode on the back surface side of the substrate. An increase in the amount of holes can be achieved by increasing the concentration of the collector region (refer to FIGS. 32 and 33). The increase in the concentration of the collector region, however, inevitably increases residual carriers on the back surface side of the substrate when the IGBT is switched OFF. These residual carriers may therefore be discharged by depletion or be caused to disappear by recombination. This may become a cause for deteriorating the switching off loss performance. This means that there is a trade-off relationship between load short circuit withstand and switching off loss performance.

The present embodiment therefore provides, in order to overcome the above-described problems, a technology of not deteriorating the switching off loss performance but achieving a trench gate IGBT having a low ON voltage and at the same time, having high load short circuit withstand.
(First Embodiment)

The related art of a trench gate IGBT is disclosed, for example, by Japanese Unexamined Patent Application Publication No. 2013-140885. Japanese Unexamined Patent Application Publication No. 2013-140885 (Patent Document 1) discloses (1) a planar structure of a cell region and therearound, (2) a narrow active cell type unit cell and alternate arrangement system, and (3) an active cell two-dimensional thinned-out structure so that an overlapping portion will not be repeated in principle.
<Structure of Trench Gate IGBT>

Figure 2:
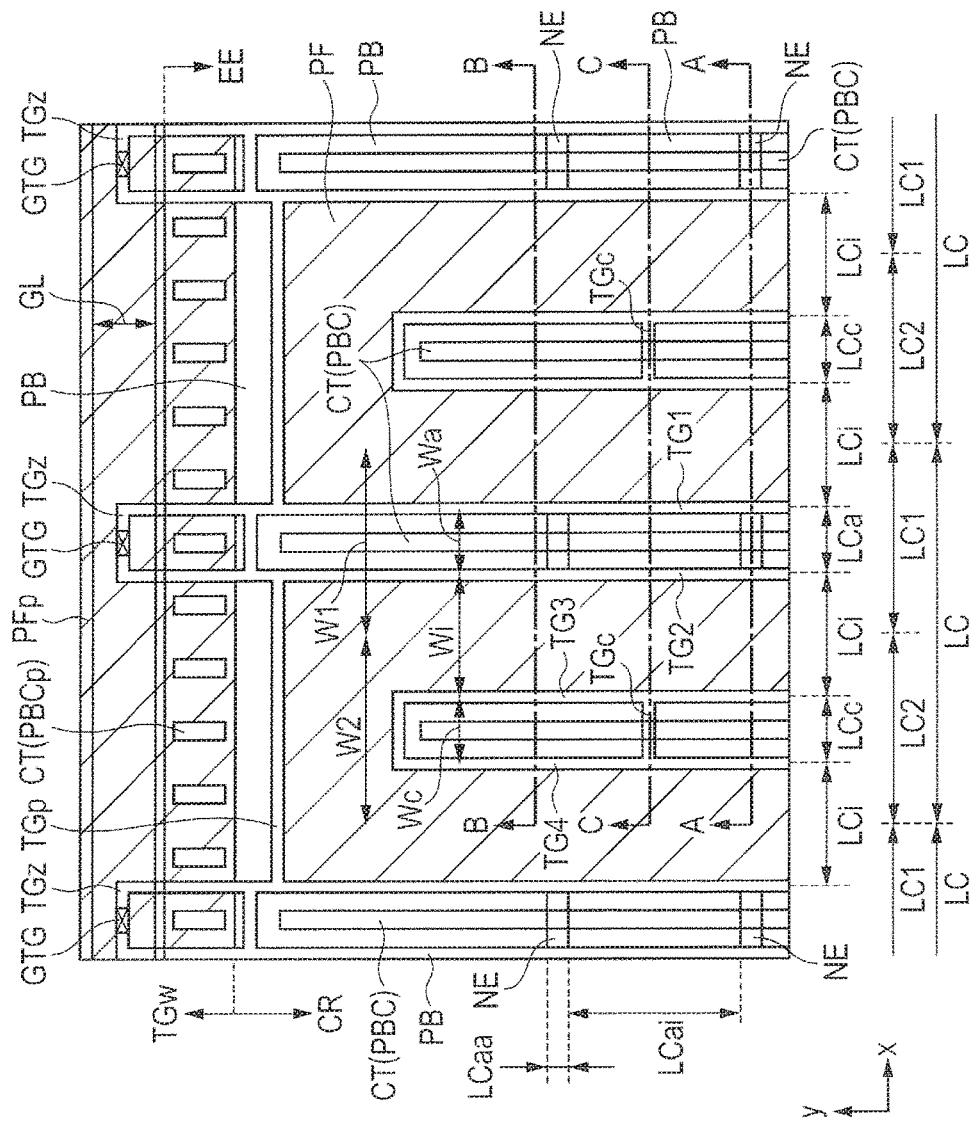
FIG. 2 is a partially enlarged fragmentary plan view showing an active portion of the semiconductor device according to First Embodiment.
Figure 3:
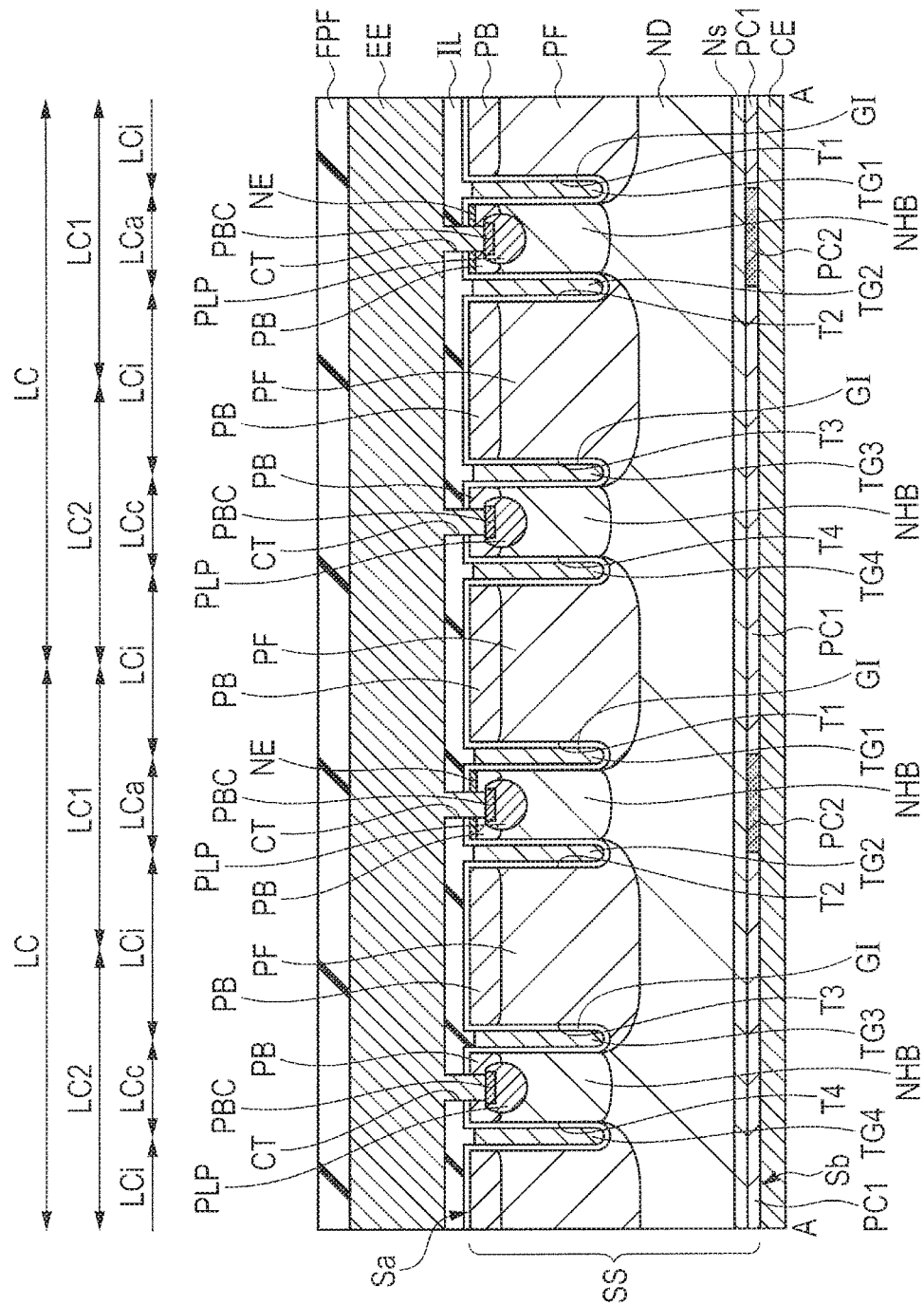
FIG. 3 is a fragmentary cross-sectional view taken along the line A-A shown in FIG. 2.
Figure 4:
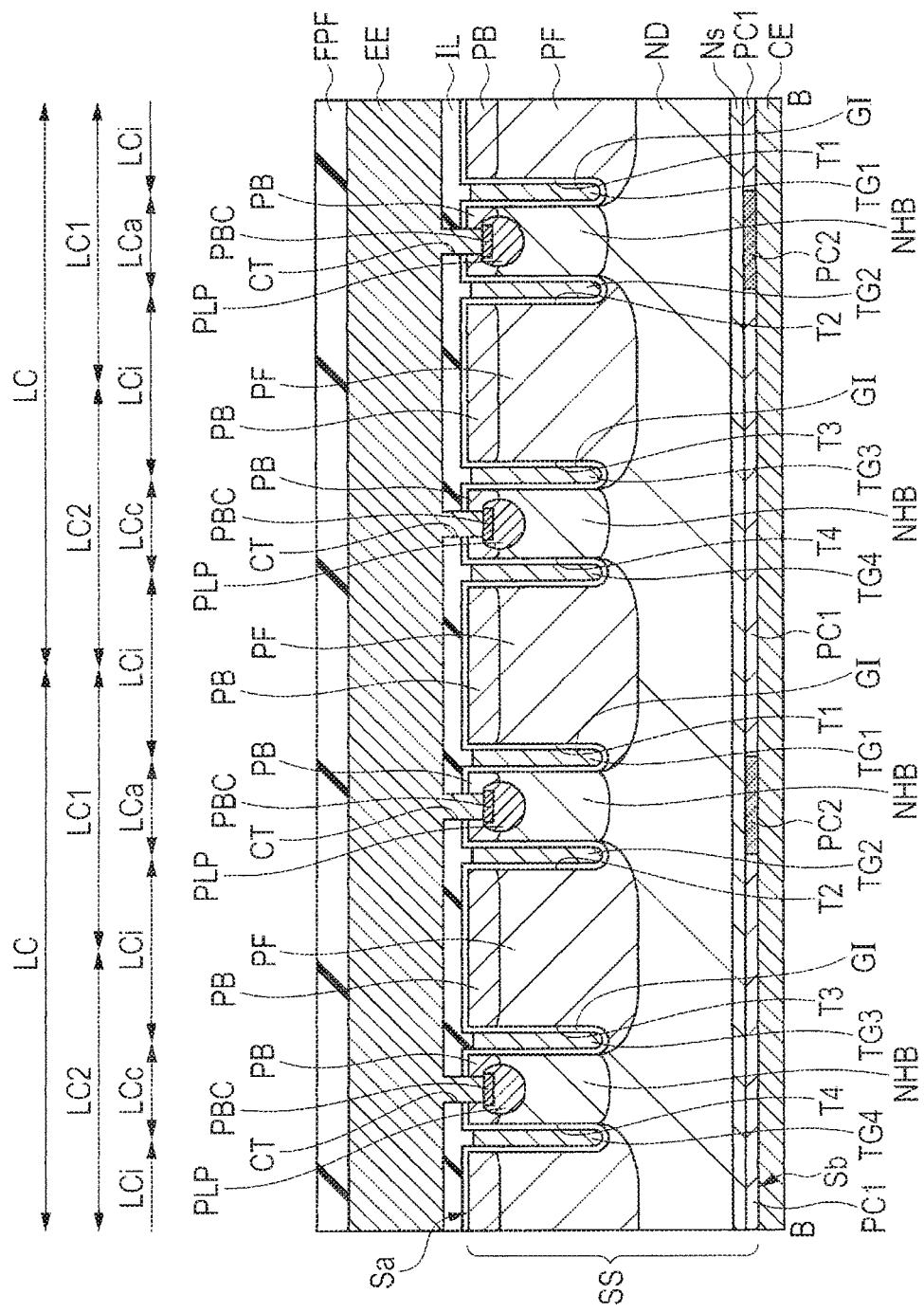
FIG. 4 is a fragmentary cross-sectional view taken along the line B-B shown in FIG. 2.
Figure 5:
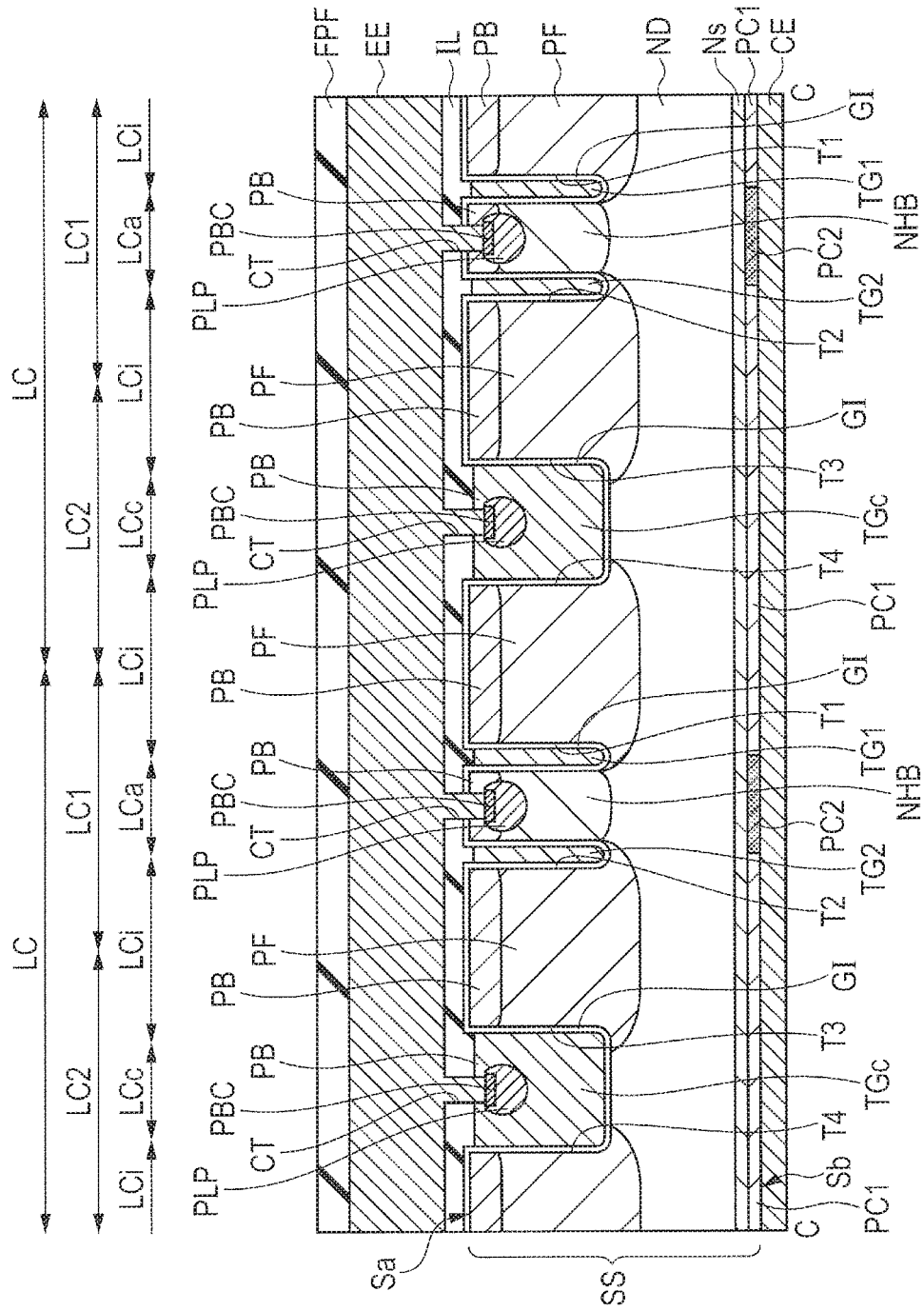
FIG. 5 is a fragmentary cross-sectional view taken along the line C-C shown in FIG. 2.

A semiconductor device including a trench gate IGBT according to First Embodiment will be described referring to FIGS. 1 to 5. FIG. 1 is a fragmentary plan view of a semiconductor device (semiconductor chip) equipped with a trench gate IGBT according to First Embodiment. FIG. 2 is a partially enlarged fragmentary plan view showing an active portion of the semiconductor device according to First Embodiment. FIGS. 3 to 5 are each a fragmentary cross-sectional view of the trench gate IGBT according to First Embodiment. FIG. 3 is a fragmentary cross-sectional view taken along the line A-A shown in FIG. 2; FIG. 4 is a fragmentary cross-sectional view taken along the line B-B shown in FIG. 2; and FIG. 5 is a fragmentary cross-sectional view taken along the line C-C shown in FIG. 2.

The trench gate IGBT described herein is a so-called EEGG type trench gate IGBT having four trench gate electrodes arranged with a space between any two adjacent ones. Two trench gate electrodes arranged at the center are each electrically coupled to a gate electrode and the other two trench gate electrodes arranged at both ends are each electrically coupled to an emitter electrode. The trench gate IGBT of First Embodiment has a breakdown voltage of, for example, about 600 V.

As shown in FIG. 1, a semiconductor chip SC has, on the upper surface at the periphery thereof, a cyclic guard ring GR and inside thereof, several (one or more) cyclic field plates FP coupled to a cyclic floating field ring or the like are provided. The guard ring GR and the field plate FP are each made of a metal film having, for example, aluminum as a main component.

The semiconductor chip SC has, inside the cyclic field plates FP and in the main portion of an active portion thereof, a cell formation region CR. The semiconductor chip SC has, on the upper surface of the active portion thereof, an emitter electrode EE that extends to the vicinity of the periphery of the semiconductor chip SC. The emitter electrode EE is made of a metal film having, for example, aluminum as a main component. The emitter electrode EE has, at the center portion thereof, an emitter pad EP for coupling a bonding wire or the like thereto.

The emitter electrode EE and the field plate FP have therebetween a gate wiring GL. The gate wiring GL has electrical coupling to the gate electrode GE. The gate wiring GL and the gate electrode GE are each made of a metal film having, for example, aluminum as a main component. The gate electrode GE has, at the center portion thereof, a gate pad GP for coupling a bonding wire or the like thereto.

As shown in FIG. 2, the cell formation region CR has therein linear unit cell regions LC regularly arranged in a first direction (x direction). Each linear unit cell region LC is comprised of a first linear unit cell region LC1 and a second linear unit cell region LC2 and in First Embodiment, width W1 of the first linear unit cell region LC1 and width W2 of the second linear unit cell region LC2 are equal or substantially equal to each other.

Each first linear unit cell region LC1 is comprised of a linear active cell region LCa at the center and a pair of half-width linear inactive cell regions LCi surrounding it. The linear active cell region LCa and the linear inactive cell region LCi have therebetween a first linear trench gate electrode TG1 or a second linear trench gate electrode TG2 electrically coupled to a gate electrode (gate electrode GE shown in FIG. 1).

On the other hand, each second linear unit cell region LC2 is comprised of a linear hole collector cell region LCc located at the center thereof and a pair of half-width linear inactive cell regions LCi surrounding it. The linear hole collector cell region LCc and the linear inactive cell region LCi have therebetween a third linear trench gate electrode TG3 or a fourth linear trench gate electrode TG4 electrically coupled to the emitter electrode EE.

The width Wa of the linear active cell region LCa and the width Wc of the linear hole collector cell region LCc are narrower than the width Wi of the linear inactive cell region LCi. Thus, the trench gate IGBT in First Embodiment is a so-called "narrow active cell type unit cell".

The linear active cell region LCa or the linear hole collector cell region LCc, and the linear inactive cell region LCi are arranged alternately to configure the linear unit cell region LC. The trench gate IGBT according to First Embodiment therefore takes a so-called "alternate arrangement system".

The linear active cell region LCa and the linear hole collector cell region LCc each have, at the center portion thereof, a contact trench CT along a second direction (y direction, longer direction) orthogonal to the first direction (x direction) and the lower end portion of it reaches a P+ type body contact region PBC formed in the semiconductor substrate.

The linear active cell region LCa has therein an active section LCaa, that is, a region having therein N+ type emitter regions NE regularly arranged in the second direction (y direction, longer direction) and an inactive section LCai, that is, a region (P type body region PB) having no N+ type emitter region NE. These regions are arranged alternately.

The linear hole collector cell region LCc has therein connector trench gate electrodes (emitter coupling portions) TGc arranged regularly in the second direction (y direction, longer direction). These connector trench gate electrodes couple the third linear trench gate electrode TG3 and the fourth linear trench gate electrode TG4 to each other. At the intersection between the connector trench gate electrode (emitter coupling portion) TGc and the contact trench CT (P+ type body contact region PBC), the third linear trench gate electrode TG3 and the fourth linear trench gate electrode TG4 are coupled to each other and are then electrically coupled to the emitter electrode EE.

In First Embodiment, the width We of the linear hole collector cell region LCc and the width Wa of the linear active cell region LCa are equal or substantially equal to each other, which is, however, not essential. Their widths equal or substantially equal to each other, however, have an advantage that the hole distribution becomes uniform.

The linear inactive cell region LCi has therein a P type floating region PF. In First Embodiment, the P type floating region PF has such a structure that it has a depth greater than that of the lower end portion of the respective trenches having therein first, second, third, and fourth linear trench gate electrodes TG1, TG2, TG3, and TG4 and covers the lower end portion. Such a structure is not essential but is advantageous because it facilitates maintenance of a breakdown voltage even when the width Wi of the linear inactive cell region LCi in the first direction (x direction) is made greater than the width Wa of the linear active cell region LCa in the first direction (x direction). In First Embodiment, the width Wa of the linear active cell region LCa in the first direction (x direction) is made smaller than the width Wi of the linear inactive cell region LCi in the first direction (x direction), which is not essential, but can enhance the IE effect.

The cell formation region CR partially has, outside the periphery thereof, for example, a P type floating region PFp that extends so as to surround the cell formation region and this P type floating region PFp is electrically coupled to the emitter electrode EE through the contact trench CT (P+ type body contact region PBCp).

In addition, the cell formation region CR has, outside the periphery thereof, for example, a gate wiring GL. The first linear trench gate electrode TG1 and the second linear trench gate electrode TG2 extend toward this gate wiring GL from the inside of the cell formation region CR. A trench gate electrode TGz that couples the respective end portions of the extensions (that is, gate lead portions TGw) of the first linear trench gate electrode TG1 and the second linear trench gate electrode TG2 with each other has electrical coupling to the gate wiring GL via a (gate wiring)-(trench gate electrode) coupling portion GTG. An end trench gate electrode TGp partitions between the linear inactive cell region LCi and the peripheral outside of the cell formation region CR.

Next, the cross-sectional structure taken along the line A-A of FIG. 2 will be described referring to FIG. 3.

As shown in FIG. 3, an N⁻ type drift region ND occupies the main portion of the semiconductor substrate SS and the semiconductor substrate SS has, on the back surface (second main surface, bottom surface) Sb side thereof, an N type field stop region Ns contiguous to the N⁻ type drift region ND. The N type field stop region Ns has an impurity concentration of, for example, from about $1 \times 10^{15}$ to $1 \times 10^{17}/\text{cm}^3$.

Further, the N type field stop region Ns has, on the side opposite to the N⁻ type drift region ND, a P+ type first collector region PC1 and a P++ type second collector region PC2. The P++ type second collector region PC2 is on the back surface Sb side of the semiconductor substrate SS in the linear active cell region LCa.

The P++ type second collector region PC2 has an impurity concentration higher than that of the P+ type first collector region PC1. The P+ type first collector region PC1 has an impurity concentration of, for example, from about $1 \times 10^{16}$ to $1 \times 10^{17}/\text{cm}^3$, while the P++ type second collector region PC2 has an impurity concentration of, for example, from about $1 \times 10^{17}$ to $1 \times 10^{18}/\text{cm}^3$.

The semiconductor substrate SS has, on the back surface Sb thereof, a collector electrode CE to be electrically coupled to the P+ type first collector region PC1 and the P++ type second collector region PC2. The collector electrode CE is made of, for example, a stacked film (AlSi/Ti/Ni/Au) obtained by successively stacking aluminum silicon (AlSi), titanium, nickel, and gold successively on the back surface Sb of the semiconductor substrate SS. An electrode material containing aluminum is therefore in contact with the back surface Sb of the semiconductor substrate SS.

On the other hand, the semiconductor substrate SS has a P type body region PB on almost the entire surface (almost the entire surface in the cell formation region CR) on the side of the surface (first main surface, upper surface) Sa of the substrate.

The semiconductor substrate SS has, on the surface Sa side thereof at a boundary between the linear active cell region LCa and the linear inactive cell region LCi, a first trench T1 and a second trench T2. They have, inside thereof, a first linear trench gate electrode TG1 and a second linear trench gate electrode TG2 via a gate insulating film GI, respectively.

The first linear trench gate electrode TG1 and the second linear trench gate electrode TG2 have electrical coupling to a gate electrode (the gate electrode GE shown in FIG. 1). The first linear trench gate electrode TG1 is in the first trench T1 formed in the semiconductor substrate SS, while extending from the lower end portion to the upper portion of the trench. Similarly, the second linear trench gate electrode TG2 is in the second trench T2 formed in the semiconductor substrate SS, while extending from the lower end portion to the upper portion of the trench.

The semiconductor substrate SS has, on the surface Sa side thereof at a boundary between the linear hole collector cell region LCc and the linear inactive cell region LCi, a third trench T3 and a fourth trench T4. They have therein a third linear trench gate electrode TG3 and a fourth linear trench gate electrode TG4 via the gate insulating film GI.

The third linear trench gate electrode TG3 and the fourth linear trench gate electrode TG4 have electrical coupling to the emitter electrode EE. The third linear trench gate electrode TG3 is the third trench T3 famed in the semiconductor substrate SS, while extending from the lower end portion to the upper portion of the trench. Similarly, the fourth linear trench gate electrode TG4 is in the fourth trench T4 famed in the semiconductor substrate SS, while extending from the lower end portion to the upper portion of the trench.

In the linear active cell region LCa, the semiconductor substrate SS has, on the surface side Sa thereof, the $N^+$ type emitter region NE and the contact trench CT has, at the lower end portion thereof, the $P^+$ type body contact region PBC. This $P^+$ type body contact region PBC has therebelow a $P^+$ type latch-up prevention region PLP and the $P^+$ type latch-up prevention region PLP has therebelow an N type hole barrier region NHB. The impurity doped structure in the linear hole collector cell region Lcc is similar to that of the linear active cell region LCa except for omission of the $N^+$ type emitter region NE.

In the linear inactive cell region LCi, the semiconductor substrate SS has, on the surface Sa side thereof below the P type body region PB, a P type floating region PF deeper than, for example, the first, second, third, and fourth trenches T1, T2, T3, and T4. As shown here, in First Embodiment, the linear hole collector cell region LCc also has, similar to the linear active cell region LCa, an N type hole barrier region NHB, a $P^+$ type latch-up prevention region PLP, and the like, but they are not essential. By providing them, however, total balance of the flow of holes can be maintained.

The semiconductor substrate SS has, on almost the entirety of the surface Sa thereof, an interlayer insulating film IL made of, for example, silicon oxide. The interlayer insulating film IL has thereon an emitter electrode EE made of a metal film having, for example, aluminum as a main component and it has coupling to the $N^+$ type emitter region NE and the $P^+$ type body contact region PBC via the contact trench CT.

The emitter electrode EE further has therein a final passivation film FPF made of, for example, a polyimide-based organic insulating film.

Next, the cross-sectional structure taken along the line B-B of FIG. 2 will be described referring to FIG. 4.

As shown in FIG. 4, in this cross-section, even the linear active cell region LCa does not have therein the $N^+$ type emitter region NE so that the linear active cell region LCa and the linear hole collector cell region LCc are the same in this drawing. The other partial structure is the same as that described referring to FIG. 3. Needless to say, this drawing is similar to FIG. 3 in which the first linear trench gate electrode TG1 and the second linear trench gate electrode TG2 have electrical coupling to a gate electrode (the gate electrode GE shown in FIG. 1), but is different from FIG. 3 in which the third linear trench gate electrode TG3 and the fourth linear trench gate electrode TG4 have electrical coupling to the emitter electrode EE.

Next, the cross-sectional structure taken along the line C-C of FIG. 2 will be described referring to FIG. 5.

As shown in FIG. 5, the structure other than the linear hole collector cell region LCc is similar to that described referring to FIG. 4. The linear hole collector cell region LCc has a structure that almost the whole portion is occupied by only the connector trench gate electrode TGc (emitter coupling portion).

In First Embodiment, the trench gate IGBT having a "narrow active cell type unit cell" has been described specifically, but needless to say, the description can be applied to not only this but also to a trench gate IGBT having a "non-narrow active cell type unit cell".

Further, in First Embodiment, the trench gate IGBT having an "alternate arrangement system" has been described specifically, but needless to say, the description can be applied to not only this but also to a trench gate IGBT having a "non-alternate arrangement system".

An example of the main dimensions of each member (refer to FIGS. 1 to 5) of the trench gate IGBT is shown here in order to more specifically exemplify the structure of the trench gate IGBT.

The width Wa of the linear active cell region LCa is about 1.3 μm and the width Wi of the linear inactive cell region LCi is about 3.3 μm. The width Wa of the linear active cell region LCa is preferably smaller than the width Wi of the linear inactive cell region LCi and a Wi/Wa ratio falls particularly preferably within a range of, for example, from 2 to 3.

The width of the contact trench CT is about 0.3 μm. The width of the first, second, third, and fourth trenches T1, T2, T3, and T4 is about 0.7 μm (particularly preferably 0.8 μm or smaller) and their depth is about 3 μm. The depth of the $N^+$ type emitter region NE from the surface Sa of the semiconductor substrate SS is about 0.25 μm, the depth of the P type body region PB (channel region) is about 0.8 μm, the depth of the $P^+$ type latch-up prevention region PLP is about 1.4 μm, and the depth of the P type floating region PF is about 4.5 μm. The depth of the N type field stop region Ns from the back surface Sb of the semiconductor substrate SS is about 2.0 μm and the depth of the $P^+$ type first collector region PC1 and the $P^{++}$ type second collector region PC2 is from about 0.25 to 1.0 μm.

The thickness of the semiconductor substrate SS is from about 60 to 70 μm (the thickness when a breakdown voltage required is about 600 V). The thickness of the semiconductor substrate SS highly depends on the breakdown voltage required.

It is therefore, for example, about 120 μm when a breakdown voltage required is 1,200 V and about 40 μm when a required breakdown voltage is 400 V.

In the following example, members corresponding to them have dimensions almost equal to the above-described ones so that a description on them will not be repeated.

<Advantage of of Trench Gate IGBT>

Figure 6:
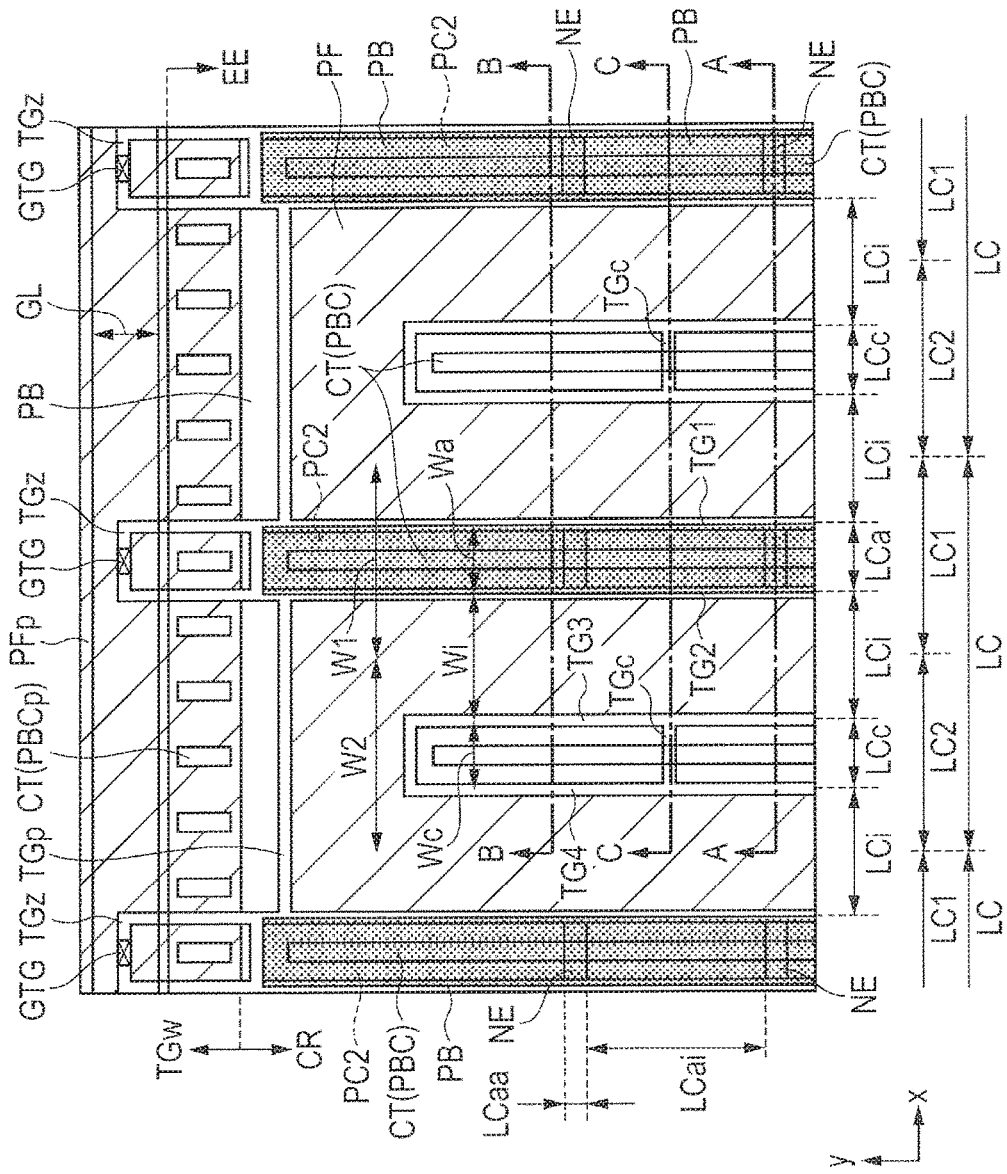
FIG. 6 is a partially enlarged fragmentary plan view showing an active portion of the semiconductor device according to First Embodiment.
Figure 7:
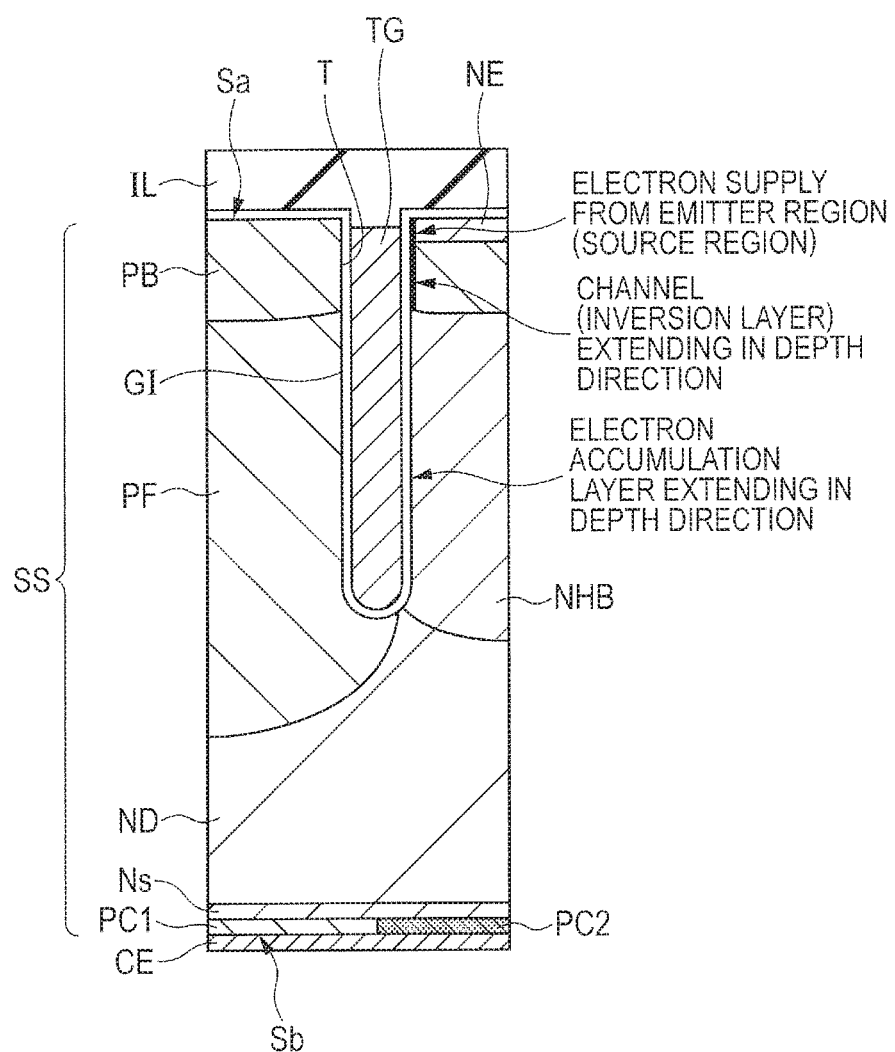
FIG. 7 is a partially enlarged fragmentary cross-sectional view showing a linear active cell region according to First Embodiment.

The advantage of the trench gate IGBT of First Embodiment will be described referring to FIGS. 6 and 7. FIG. 6 is a partially enlarged fragmentary plan view showing an active portion of the semiconductor device according to First Embodiment. FIG. 7 is a partially enlarged fragmentary cross-sectional view showing a linear active cell region according to First Embodiment.

The trench gate IGBT of First Embodiment is characterized in that a partial region of a collector region famed on the back surface Sb side of the semiconductor substrate SS is provided with the $P^{++}$ type second collector region PC2 having a concentration as relatively high as from about $1\times10^{17}$ to $1\times10^{18}/cm^3$.

As described above in the problem (1), it is important not to apply an excessive collector current in order to ensure load short circuit withstand, but a reduction in collector current is accompanied by an increase in ON voltage. Since the $P^{++}$ type second collector region PC2 is provided, an increase in field intensity on the back surface Sb side of the semiconductor substrate SS due to the Kirk effect can be suppressed even if a collector current is increased. It is therefore possible to ensure the load short circuit withstand.

As described in the problem (2), however, providing the $P^{++}$ type second collector region PC2 on the entire surface on the back surface side Sb of the semiconductor substrate SS increases residual carriers on the back surface Sb side of the semiconductor substrate SS at the time of switching off and deteriorates the switching off loss performance.

In the trench gate IGBT of First Embodiment, therefore, a partial region on the back surface Sb side of the semiconductor substrate SS, more specifically, the linear active cell region LCa is provided with the $P^{++}$ type second collector region PC2. This offsets the injected electrons with holes in this $P^{++}$ type second collector region PC2 and suppresses deterioration in switching off loss performance. FIG. 6 shows a plan view in which the $P^{++}$ type second collector region PC2 has been overlapped with FIG. 2. FIG. 6 shows the $P^{++}$ type second collector region PC2 shaded by hatching.

As shown in FIG. 7, by applying a positive voltage to the linear trench gate electrode TG electrically coupled to the gate electrode (gate electrode GE shown in FIG. 1), a channel (inversion layer) is formed in the P type body region PB on the side surface of the trench T having therein the linear trench gate electrode TG and the channel extends in the depth direction (back surface Sb direction of the semiconductor substrate SS). Further, an electron accumulation layer is formed med in the N type hole barrier region HNB on the side surface of the trench T and the electron accumulation layer extends in the depth direction (the back surface Sb direction of the semiconductor substrate SS). Electrons supplied from the $N^+$ type emitter region NE then flow the channel and the electron accumulation layer and reach the back surface Sb side of the semiconductor substrate SS. The electrons supplied from the surface Sa side of the semiconductor substrate SS are likely to reach the collector electrode CE right below and around the interface between the trench T and the $N^+$ type emitter region NE.

In First Embodiment, therefore, the $P^{++}$ type second collector region PC2 is provided in the back surface Sb side region of the semiconductor substrate SS which many electrons are presumed to reach. Described specifically, as shown above in FIGS. 3 to 6, the $P^{++}$ type second collector region PC2 is provided in the back surface Sb side region of the semiconductor substrate SS including a region right below the interface between the first trench T1 having therein the first linear trench gate electrode TG1 and the $N^+$ type emitter region NE and a region right below the interface between the second trench T2 having therein the second linear trench gate electrode TG2 and the $N^+$ type emitter region NE. In other words, the $P^{++}$ type second collector region PC2 is provided so as to include, in plan view, the interface between the first trench T1 having therein the first linear trench gate electrode TG1 and the $N^+$ type emitter region NE and the interface between the second trench T2 having therein the second linear trench gate electrode TG2 and the $N^+$ type emitter region NE. This makes it possible to realize a semiconductor device equipped with a trench gate IGBT having a low ON voltage and high load short circuit withstand without deteriorating its switching off loss performance.

It is only necessary that a region in which the $P^{++}$ type second collector region PC2 is to be formed is, in plan view, at the interface or therearound between the first trench T1 having therein the first linear trench gate electrode TG1 and the $N^+$ type emitter region NE and at the interface or therearound between the second trench T2 having therein the second linear trench gate electrode TG2 and the $N^+$ type emitter region NE. In First Embodiment, however, the $P^{++}$ type second collector region PC2 is formed in the linear active cell region LCa in consideration of the alignment margin in the manufacturing steps of the semiconductor device. The formation region of the $P^{++}$ type second collector region PC2 is not limited to the above-described one and a modification example of it will be described later.

<Method of Manufacturing Trench Gate ICBT>

The method of manufacturing the trench gate IGBT according to First Embodiment will next be described referring to FIGS. 8 to 21. FIGS. 8 to 21 are fragmentary cross-sectional views showing the manufacturing steps of the trench gate IGBT according to First Embodiment. The cell formation region will hereinafter be described mainly, while peripheral portions and the like will be understood referring to FIG. 1 as needed. Further, a specific description will be made on the first linear unit cell region LC1 including the linear active cell region LCa and the linear inactive cell region LCi and the second linear unit cell region LC2 including the linear hole collector cell region LCc and the linear inactive cell region LCi.

Figure 8:
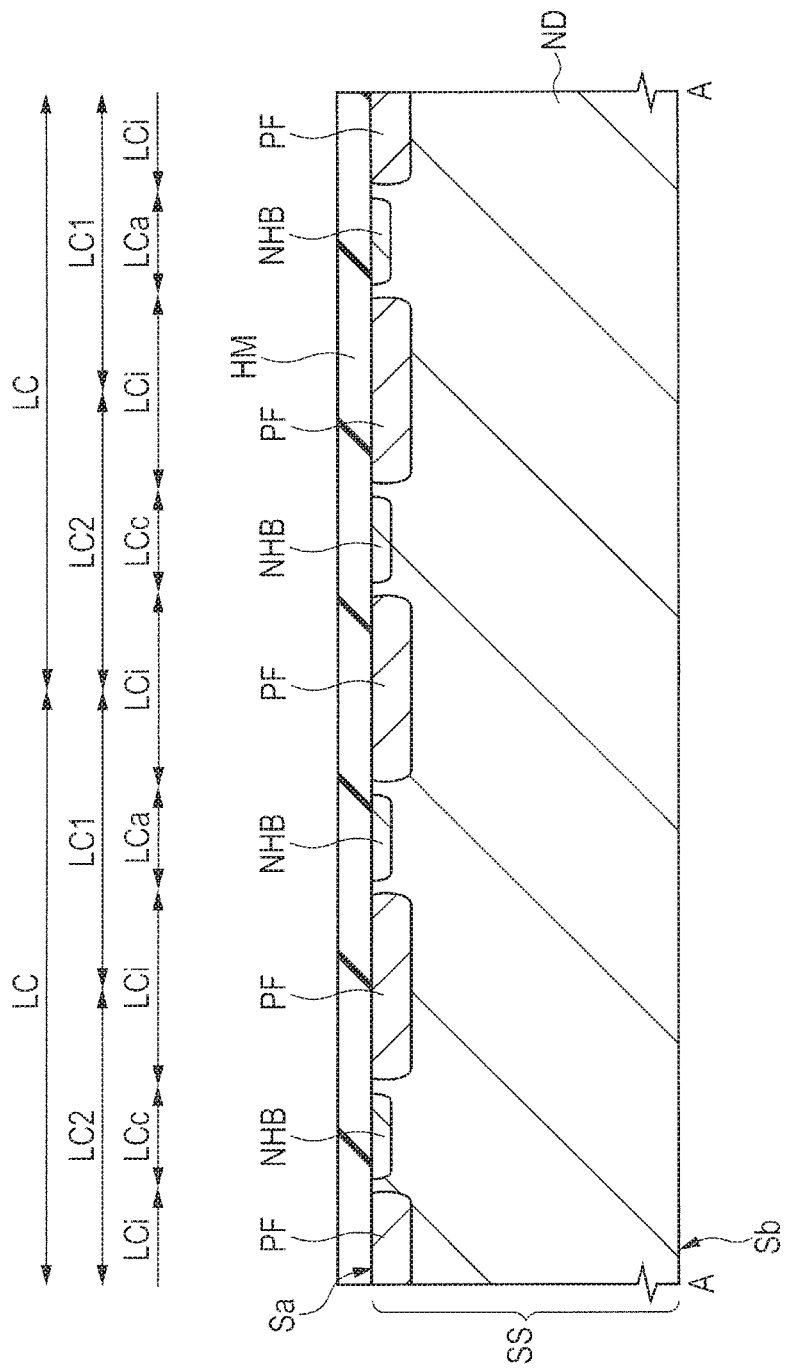
FIG. 8 is a fragmentary cross-sectional view showing a manufacturing step of a trench gate IGBT according to First Embodiment.

First, as shown in FIG. 8, a semiconductor substrate (in this stage, a substantially disk-shaped flat and thin semiconductor plate called "wafer") SS made of an $N^-$ type silicon single crystal (for example, a phosphorus concentration of about $2 \times 10^{14}/cm^3$) is provided. The semiconductor substrate SS is, for example, a 200φ wafer (the wafer diameter may be any of 150φ, 100φ, 300φ, and 450φ). The thickness of the wafer is, for example, about 800 μm (preferably, within a range of from about 450 to 1,000 μm). Here, a wafer produced, for example, by FZ (floating zone) method is most suited, but it may be produced by CZ (Czochralski) method.

Next, a resist film (not shown) for introducing an N type hole barrier region is formed on the entire surface Sa of the semiconductor substrate SS by the method of application or the like. It is patterned by ordinary lithography. An N type impurity is introduced into the surface Sa of the semiconductor substrate SS, for example, by ion implantation with the patterned resist film as a mask to form an N type hole barrier region NHB. Preferred examples of the condition employed for this ion implantation include the following condition: using phosphorus as an ion species, a dose of about $6 \times 10^{12}/cm^2$, and implantation energy of about 80 KeV. The resist film which becomes unnecessary is then removed by ashing or the like.

Next, a resist film (not shown) for introducing a P type floating region is formed on the entirety of the surface Sa of the semiconductor substrate SS by the method of application or the like, followed by patterning using ordinary lithography. A P type impurity is introduced into the surface Sa of the semiconductor substrate SS, for example, by ion implantation with the patterned resist film as a mask to form a P type floating region PF. Preferred examples of the condition employed for this ion implantation include the following condition: boron used as an ion species, a dose of about $3.5 \times 10^{13}/cm^2$, and implantation energy of about 75 KeV. Then, the resist film that becomes unnecessary is removed by ashing or the like. Simultaneously with the introduction of the P type floating region PF, for example, a cell periphery junction region and a floating field ring are introduced.

Next, a hard mask HM made of, for example, silicon oxide is formed on the entirety of the surface Sa of the semiconductor substrate SS, for example, by CVD (chemical vapor deposition). The hard mask HM has a thickness of, for example, about 450 nm.

Figure 9:
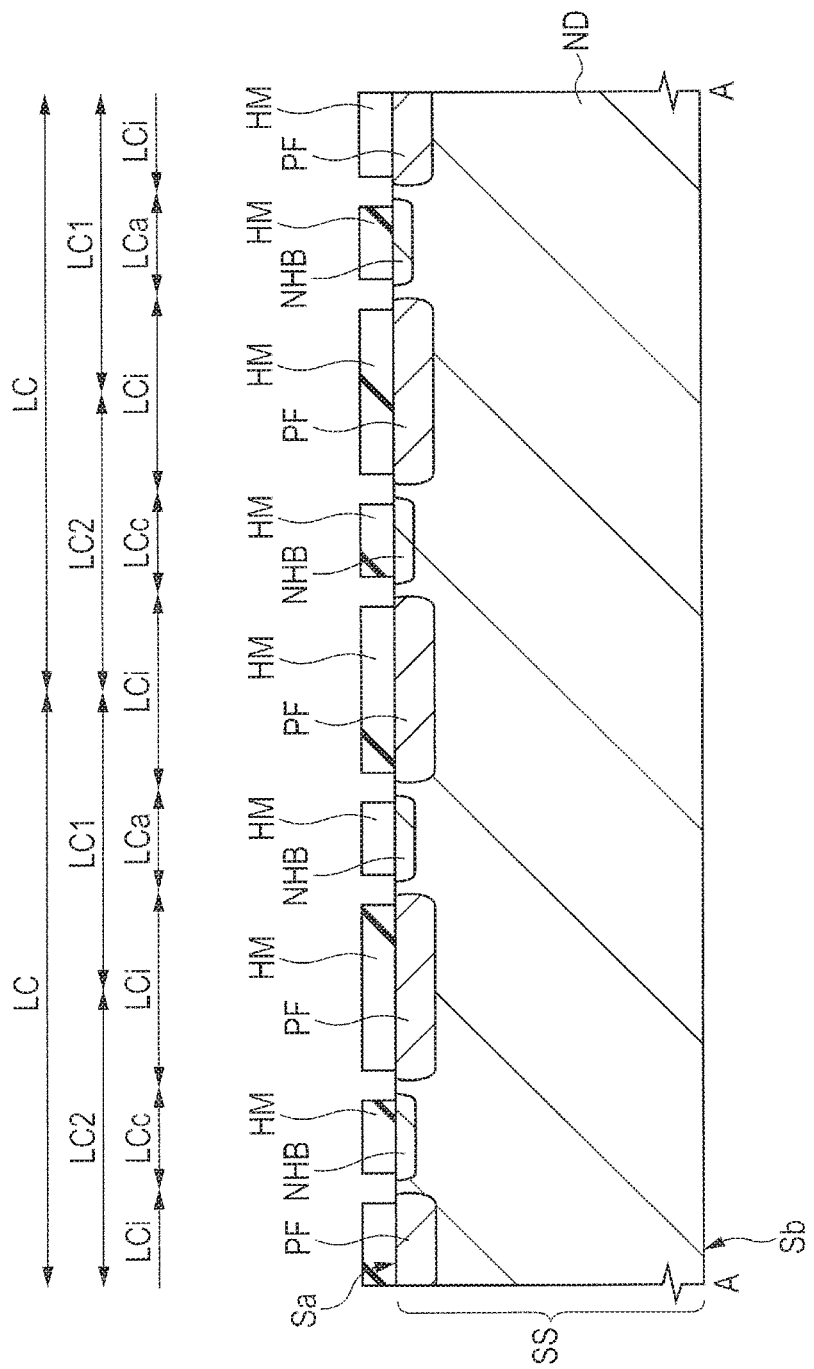
FIG. 9 is a fragmentary cross-sectional view of the trench gate IGBT during a manufacturing step following that of FIG. 8.

Next, as shown in FIG. 9, a resist film (not shown) for hard mask film processing is formed on the entirety of the surface Sa of the semiconductor substrate SS by the method of application or the like and the resulting film is patterned by ordinary lithography. The hard mask film HM is patterned, for example, by dry etching with the patterned resist film as a mask. Then, the resist film that becomes unnecessary is removed by ashing or the like.

Figure 10:
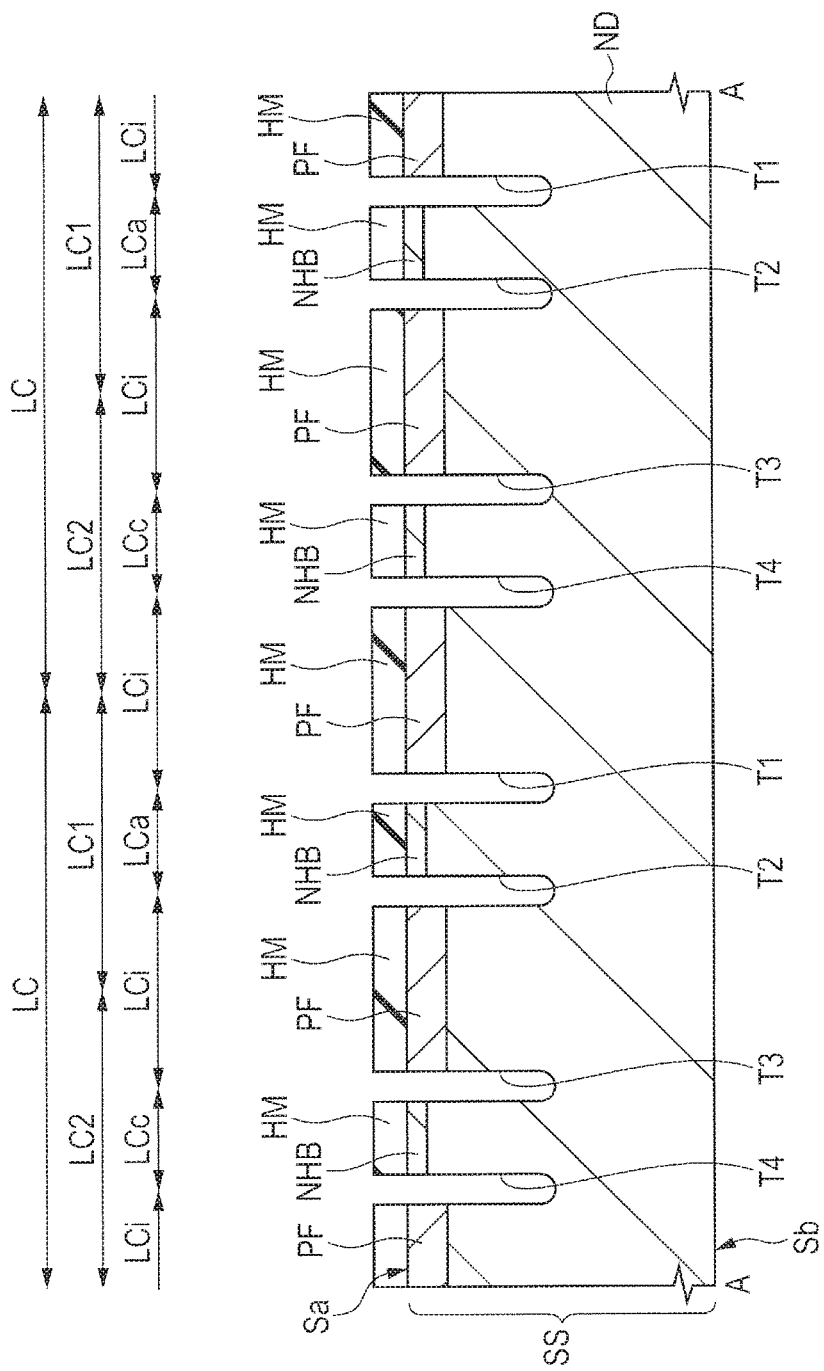
FIG. 10 is a fragmentary cross-sectional view of the trench gate IGBT during a manufacturing step following that of FIG. 9.

Next, as shown in FIG. 10, using the patterned hard mask HM, for example, anisotropic dry etching is performed to form first, second, third, and fourth trenches T1, T2, T3, and T4, respectively. Preferred examples of the gas for this anisotropic dry etching include a $Cl_2/O_2$-based gas.

By wet etching using, for example, a hydrofluoric acid-based etchant, the hard mask HM that becomes unnecessary is removed.

Figure 11:
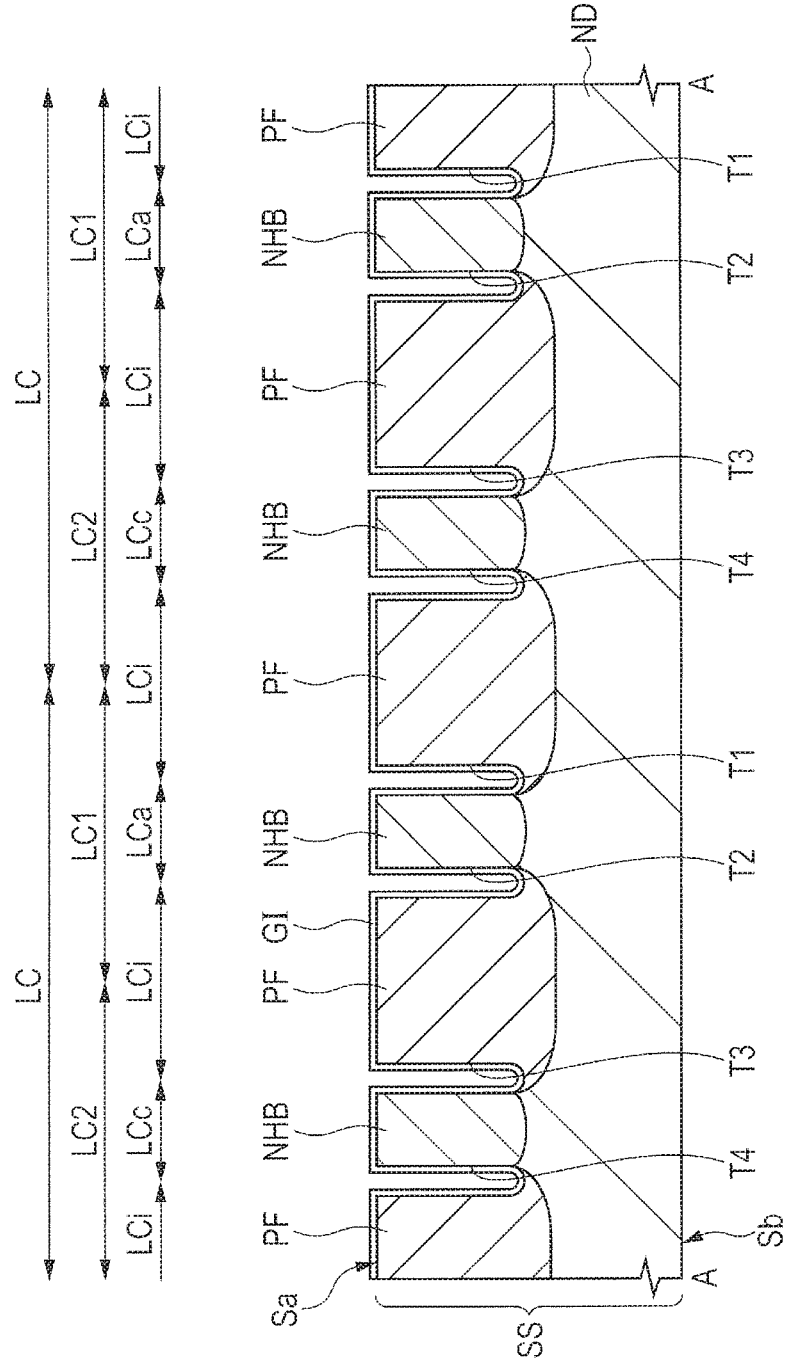
FIG. 11 is a fragmentary cross-sectional view of the trench gate IGBT during a manufacturing step following that of FIG. 10.

Next, as shown in FIG. 11, extending diffusion (for example, at 1200° C. for about 30 minutes) of the P type floating region PF and the N type hole barrier region NHB is performed. By this diffusion, the P type floating region PF becomes deeper than the lower end portions of the first, second, third, and fourth trenches T1, T2, T3, and T4 in which first, second, third, and fourth linear trench gate electrodes TG1, TG2, TG3, and TG4 are to be formed, respectively, and it covers the lower end portions. A region of the semiconductor substrate SS not having therein the P type floating region PF and the N type hole barrier region NHB becomes an $N^-$ type drift region ND.

Next, for example, by thermal oxidation, a gate insulating film GI is formed on the surface Sa of the semiconductor substrate SS and on the entire surface of the inner wall of the first, second, third, and fourth trenches T1, T2, T3, and T4. The gate insulating film GI has a thickness of, for example, about 0.12 μm.

Figure 12:
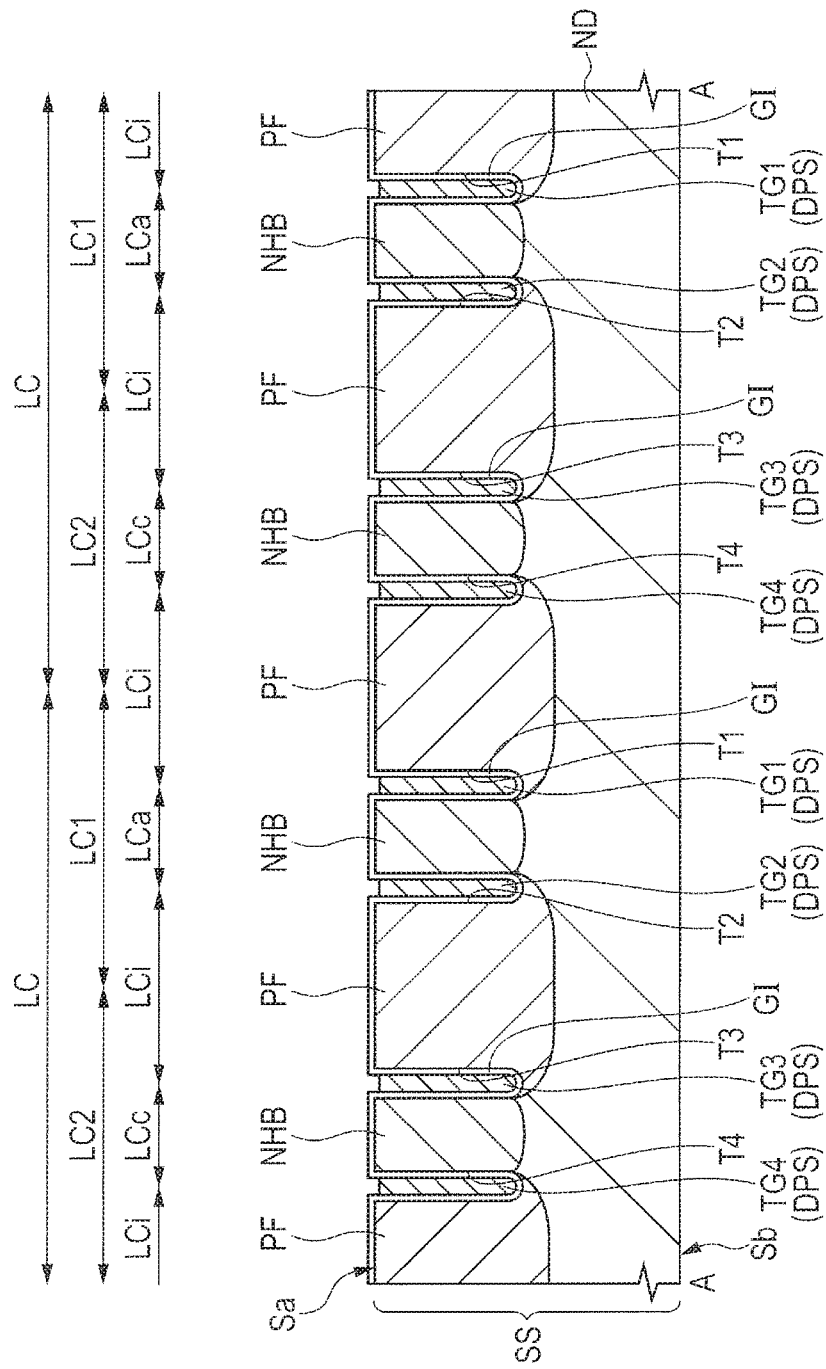
FIG. 12 is a fragmentary cross-sectional view of the trench gate IGBT during a manufacturing step following that of FIG. 11.

Next, as shown in FIG. 12, a phosphorus-doped polycrystalline silicon (doped poly-silicon) film DPS is formed, for example, by CVD on the surface Sa of the semiconductor substrate SS and inside the first, second, third, and fourth trenches T1, T2, T3, and T4. The polycrystalline silicon film DPS has a thickness of, for example, about 0.6 μm.

Next, the polycrystalline silicon film DPS is etched back, for example, by dry etching to form a first linear trench gate electrode TG1 inside the first trench T1, a second linear trench gate electrode TG2 inside the second trench T2, a third linear trench gate electrode TG3 inside the third trench T3, and a fourth linear trench gate electrode TG4 in the fourth trench T4. Preferred examples of the gas used in this etch back include $SF_6$.

Figure 13:
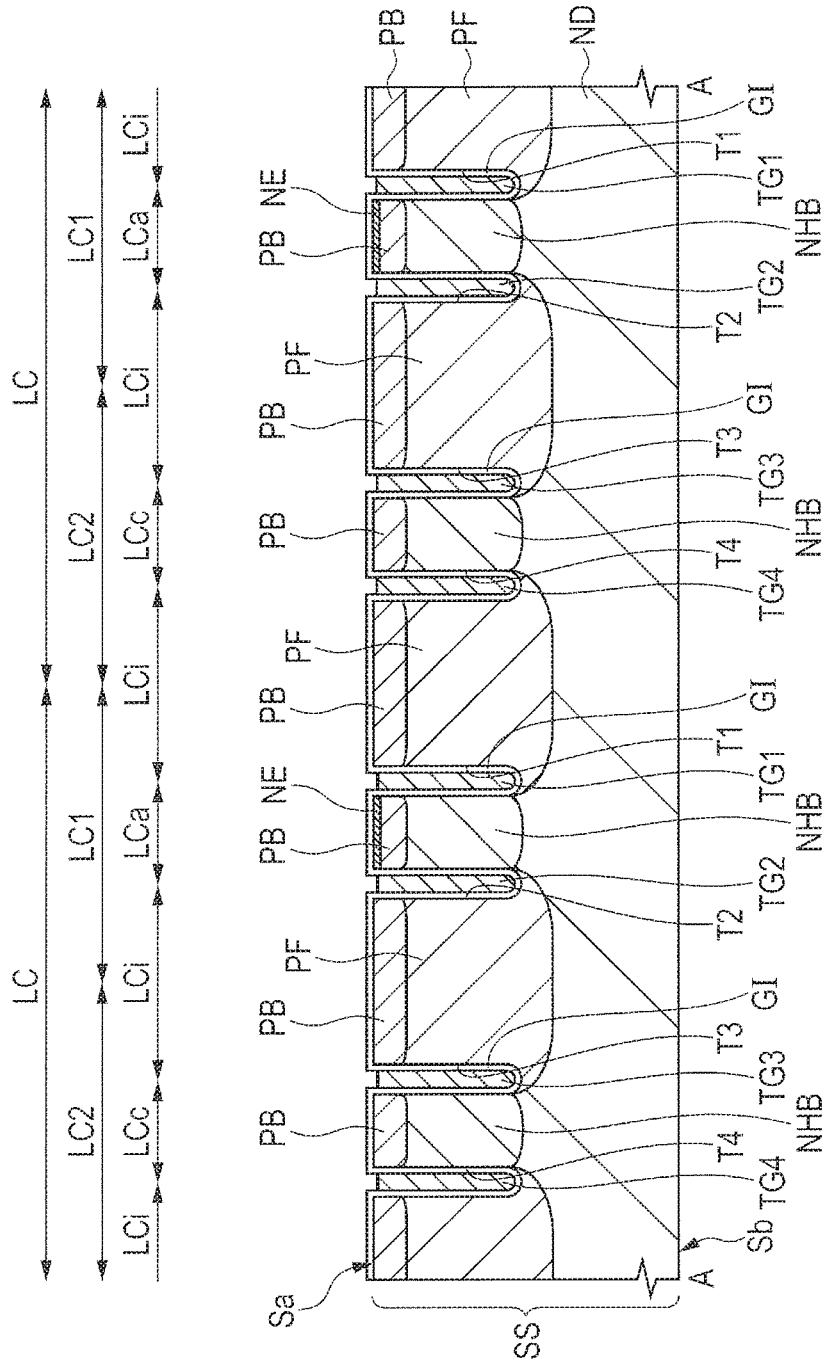
FIG. 13 is a fragmentary cross-sectional view of the trench gate IGBT during a manufacturing step following that of FIG. 12.

Next, as shown in FIG. 13, a resist film (not shown) for introducing a P type body region is formed by the method of application or the like on the entirety of the surface Sa of the semiconductor substrate SS. The film is then patterned by ordinary lithography. A P type impurity is introduced into the entire surface of the cell formation region CR and another necessary portion, for example, by ion implantation with the patterned resist film as a mask to form a P type body region PB. Preferred examples of the condition employed for this ion implantation include the following condition: boron used as an ion species, a dose of about $3\times10^{13}/cm^2$, and implantation energy of about 75 KeV. Then, the resist film that becomes unnecessary is removed by ashing or the like.

A resist film (not shown) for introducing an $N^+$ type emitter region is formed by the method of application or the like on the entirety of the surface Sa of the semiconductor substrate SS. An N type impurity is introduced into the entirety of the upper surface of the P type body region PB in the linear active cell region LCa, for example, by ion implantation with the patterned resist film as a mask to form an $N^+$ type emitter region NE. Preferred examples of the condition employed for this ion implantation include the following condition: arsenic used as an ion species, a dose of about $5\times10^{15}/cm^2$, and implantation energy of about 80 KeV. The resist film that becomes unnecessary is then removed by ashing or the like.

Figure 14:
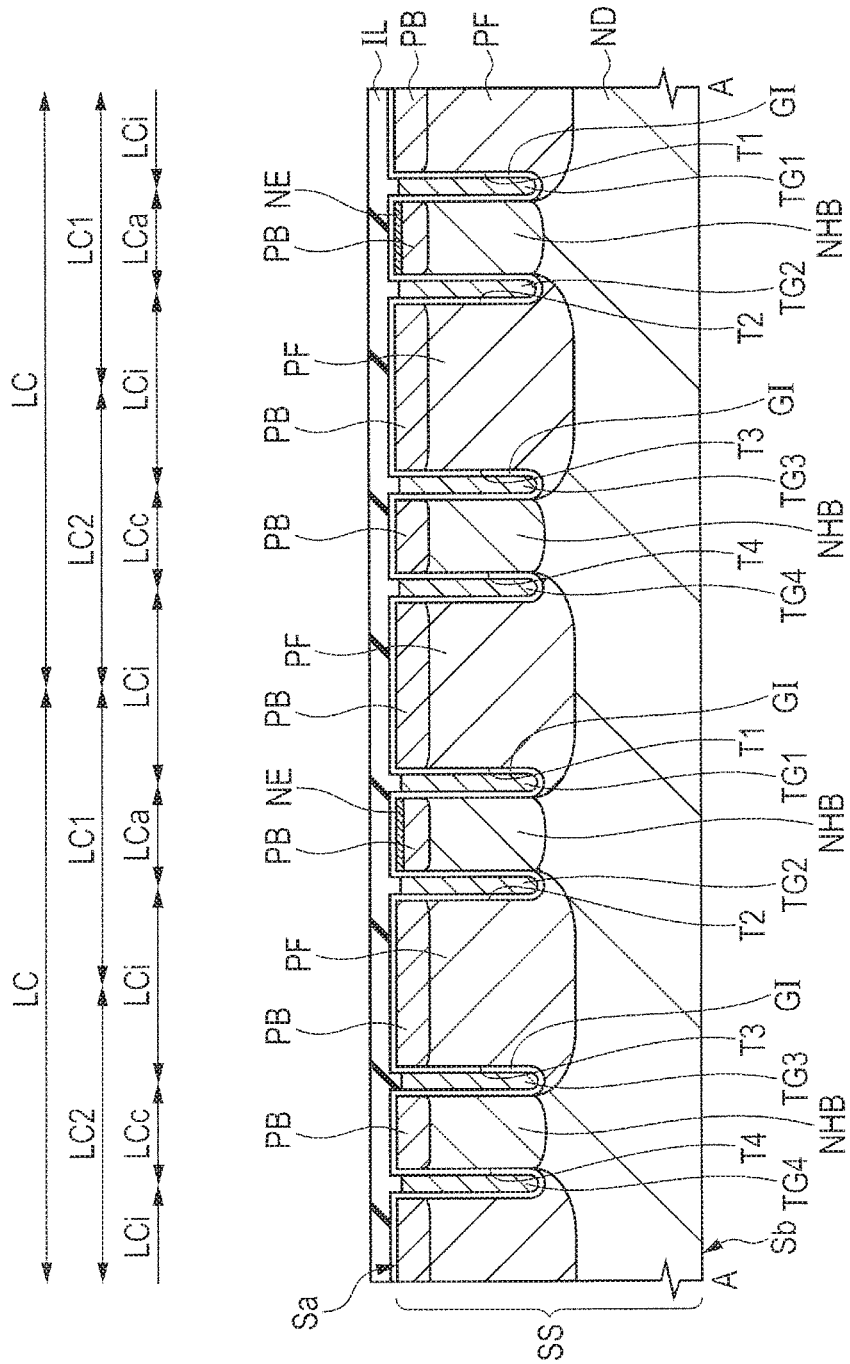
FIG. 14 is a fragmentary cross-sectional view of the trench gate IGBT during a manufacturing step following that of FIG. 13.

Next, as shown in FIG. 14, for example, a PSG (phosphosilicate glass) film is famed on the entirety of the surface Sa of the semiconductor substrate SS as an interlayer insulating film IL, for example, by CVD. The interlayer insulating film IL has a thickness of about 0.6 μm. Preferred examples of the material of this interlayer insulating film IL include, in addition to a PSG film, a BPSG (borophosphosilicate glass) film, an NSG (non-doped silicate glass) film, and an SOG (spin-on-glass) film, and a composite film thereof.

Figure 15:
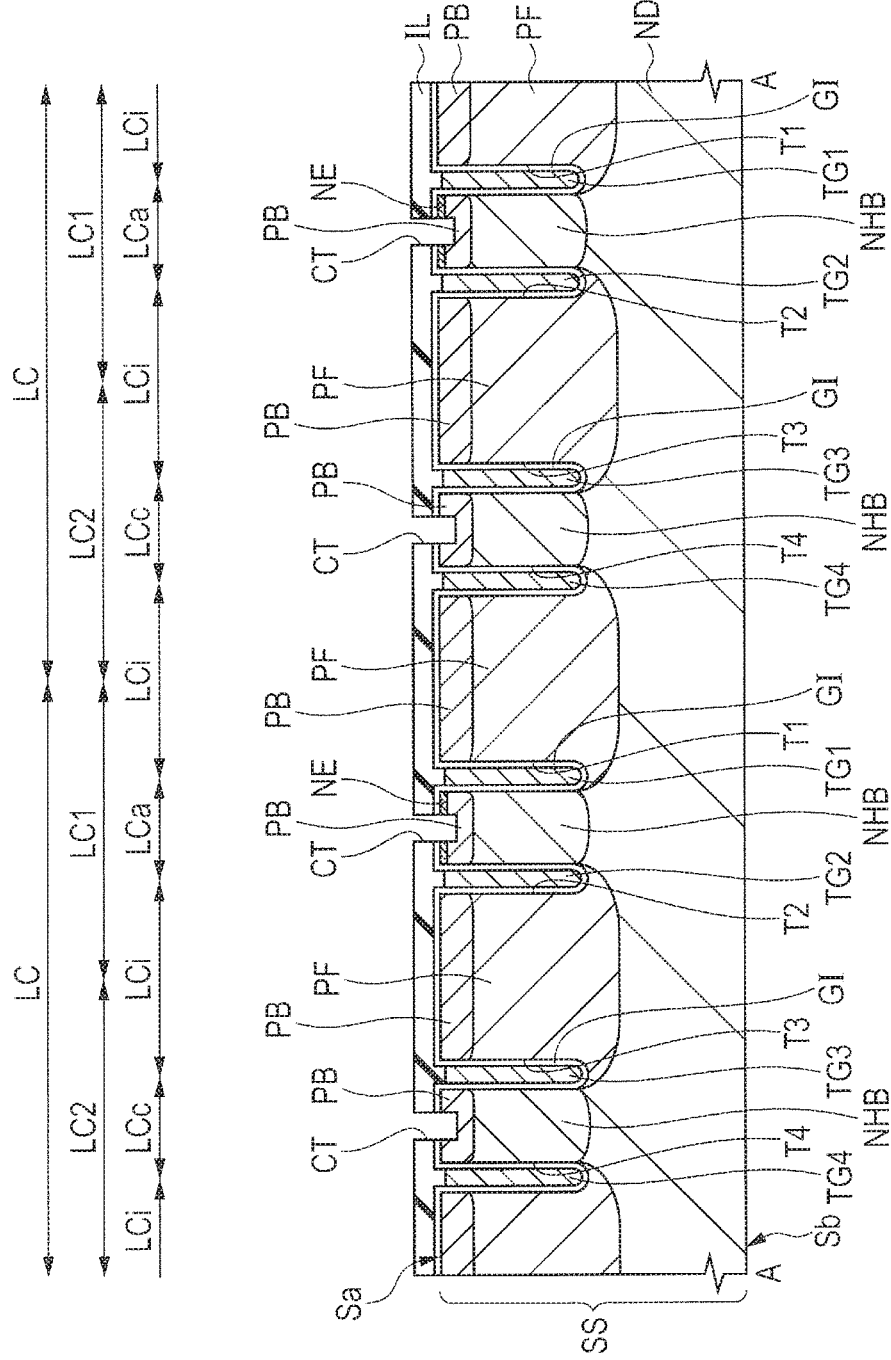
FIG. 15 is a fragmentary cross-sectional view of the trench gate IGBT during a manufacturing step following that of FIG. 14.

Next, as shown in FIG. 15, a resist film (not shown) for forming a contact trench is formed by the method of application or the like on the entire surface of the interlayer insulating film IL and is then patterned by ordinary lithography. A contact trench CT is formed, for example, by anisotropic etching with the patterned resist film as a mask. Preferred examples of the gas used for this anisotropic dry etching include $Ar/CHF_3/CF_4$-based gas. Then, the resist film that becomes unnecessary is removed by asking or the like.

Next, the contact trench CT (or contact hole) is extended in the semiconductor substrate SS, for example, by anisotropic dry etching. Preferred examples of the gas for this anisotropic dry etching include a $Cl_2/O_2$-based gas.

Figure 16:
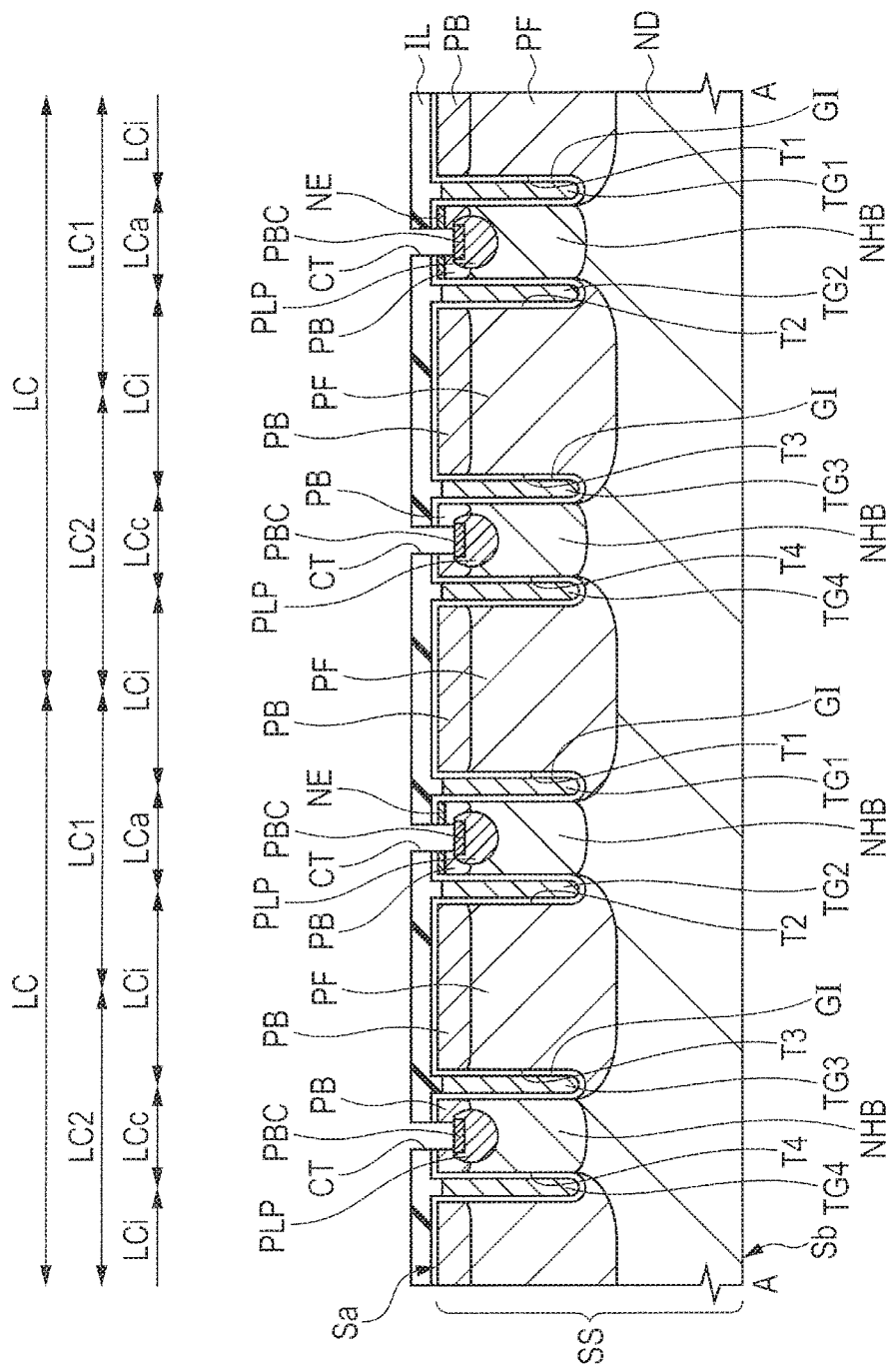
FIG. 16 is a fragmentary cross-sectional view of the trench gate IGBT during a manufacturing step following that of FIG. 15.

Next, as shown in FIG. 16, a $P^+$ type body contact region PBC is formed by the ion implantation of a P type impurity, for example, through the contact trench CT. Preferred examples of the condition employed for this ion implantation include the following condition: boron fluoride ($BF_2$) used as an ion species, a dose of about $5\times10^{15}/cm^2$, and implantation energy of about 80 KeV.

Similarly, a $P^+$ type latch-up prevention region PLP is formed, for example, by the ion implantation of a P type impurity through the contact trench CT. Preferred examples of the condition employed for this ion implantation include the following condition: boron used as an ion species, a dose of about $5\times10^{15}/cm^2$, and implantation energy of about 80 KeV.

Figure 17:
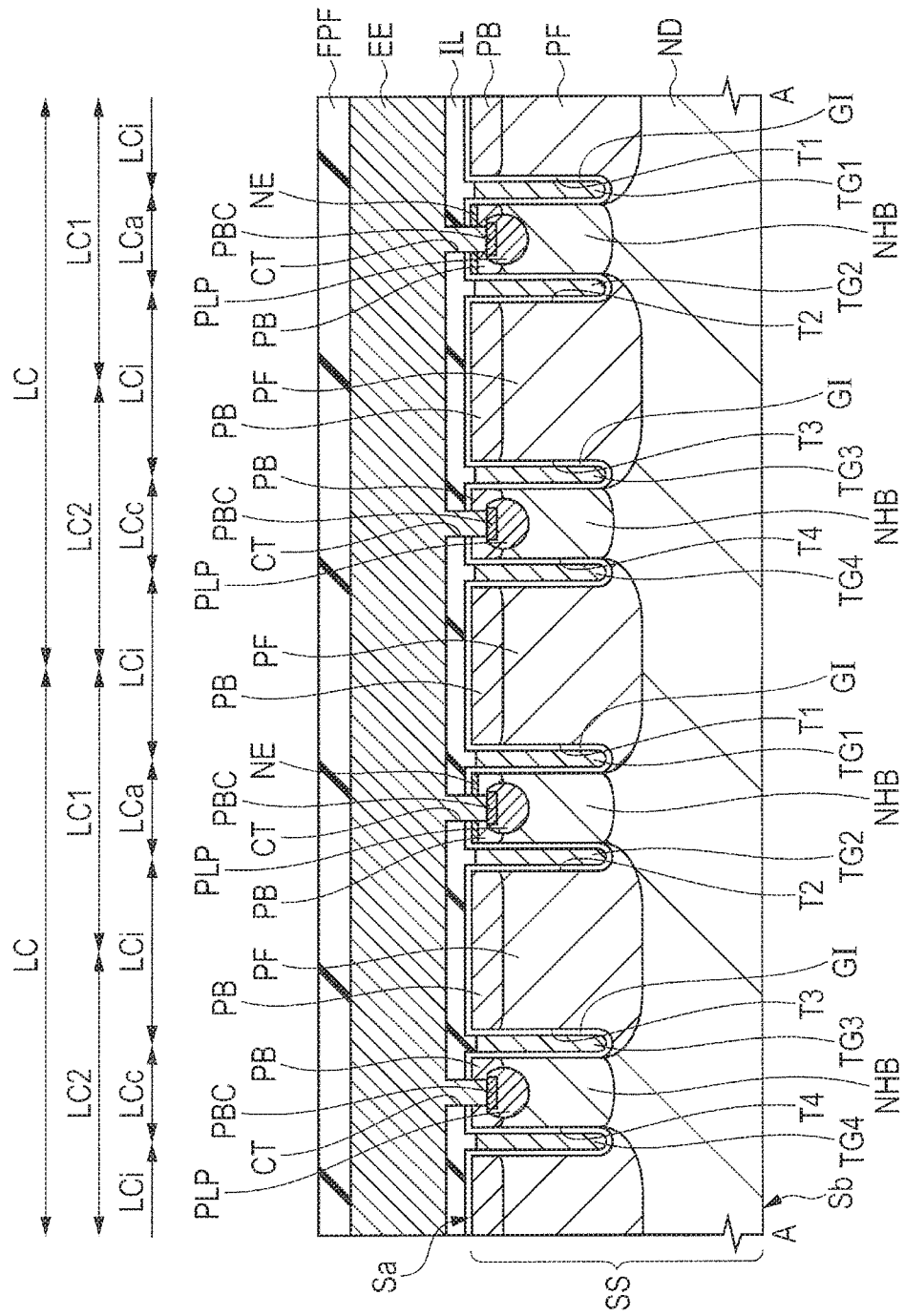
FIG. 17 is a fragmentary cross-sectional view of the trench gate IGBT during a manufacturing step following that of FIG. 16.

Next, as shown in FIG. 17, an emitter electrode EE is formed. Described specifically, it is formed, for example, in the following procedure. First, a titanium tungsten (TiW) film is farmed as a barrier metal film on the entirety of the surface Sa of the semiconductor substrate SS, for example, by sputtering. The titanium tungsten film has a thickness of, for example, about 0.2 μm. A major portion of titanium in the titanium tungsten film transfers to the silicon interface by the heat treatment conducted later to form a silicide and this contributes to improvement in the contact characteristics. These procedures are complicated so that they are not shown in the drawing.

Next, silicide annealing, for example, at 600° C. for about 10 minutes is performed in a nitrogen atmosphere. Then, an aluminum-based metal film (for example, containing aluminum and several % of silicon) is formed on the entire surface of the barrier metal film, for example, by sputtering so as to fill the contact trench CT with it. The aluminum-based metal film has a thickness of, for example, about 5 μm.

Next, a resist film (not shown) for forming an emitter electrode is formed on the entirety of the surface Sa of the semiconductor substrate SS by the method of application or the like and is then patterned by ordinary lithography. The emitter electrode EE made of the aluminum-based metal film and the barrier metal film is patterned, for example, by dry etching with the thus-patterned resist film as a mask. Preferred examples of the gas used for this dry etching include a $Cl_2/BCl_3$-based gas. The resist film that becomes unnecessary is then removed by ashing or the like.

Next, a final passivation film FPF made of an organic film or the like having, for example, polyimide as a main component is formed on the emitter electrode EE. The final passivation film FPF has a thickness of, for example, about 2.5 µm.

Next, a resist film (not shown) for forming an opening portion is formed on the entirety of the surface Sa of the semiconductor substrate SS by the method of application or the like, followed by ordinary lithography to pattern the film. The final passivation film FPF is patterned, for example, by dry etching with the patterned resist film as a mask to open an emitter pad EP or the like shown above in FIG. 1. Then, the resist film that becomes unnecessary is removed by ashing or the like.

Figure 18:
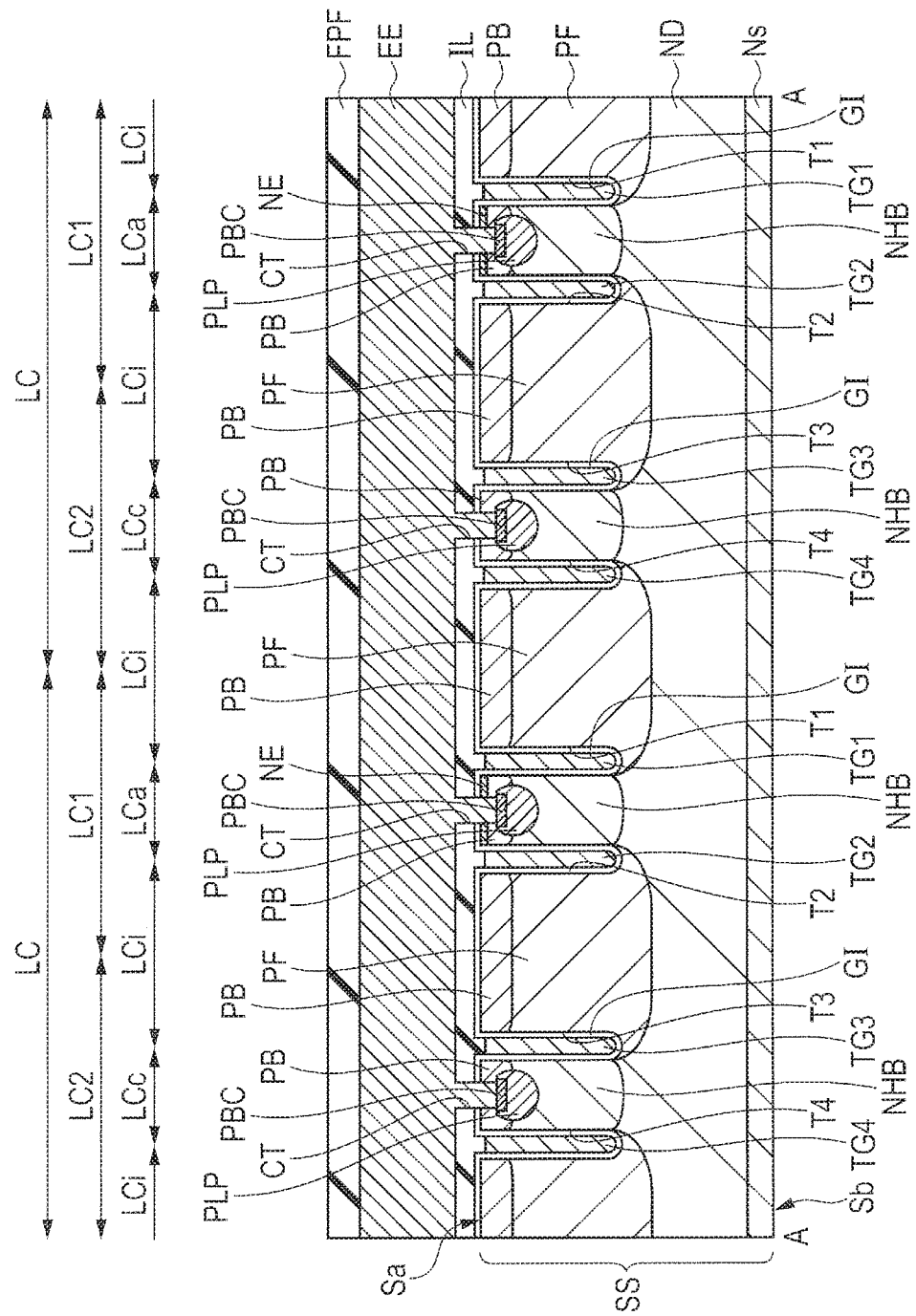
FIG. 18 is a fragmentary cross-sectional view of the trench gate IGBT during a manufacturing step following that of FIG. 17.

Next, as shown in FIG. 18, the back surface Sb of the semiconductor substrate SS is ground by back grinding treatment and the thickness is reduced from about 800 µm to, for example, from about 30 to 200 µm as needed. When the breakdown voltage is, for example, about 600 V, the final thickness is about 60 µm, and when the breakdown voltage is about 1,200 V, the final thickness is about 120 µm; and when the breakdown voltage is about 1,800 V, the final thickness is about 180 µm. If necessary, chemical etching or the like is performed to remove the damage from the back surface Sb.

Next, an N type field stop region Ns is formed by introducing an N type impurity into the entirety of the back surface Sb of the semiconductor substrate SS, for example, by ion implantation. Preferred examples of the condition employed for this ion implantation include the following condition: phosphorus used as an ion species, a dose of about $5 \times 10^{12}/cm^2$, and implantation energy of about 350 KeV.

Figure 19:
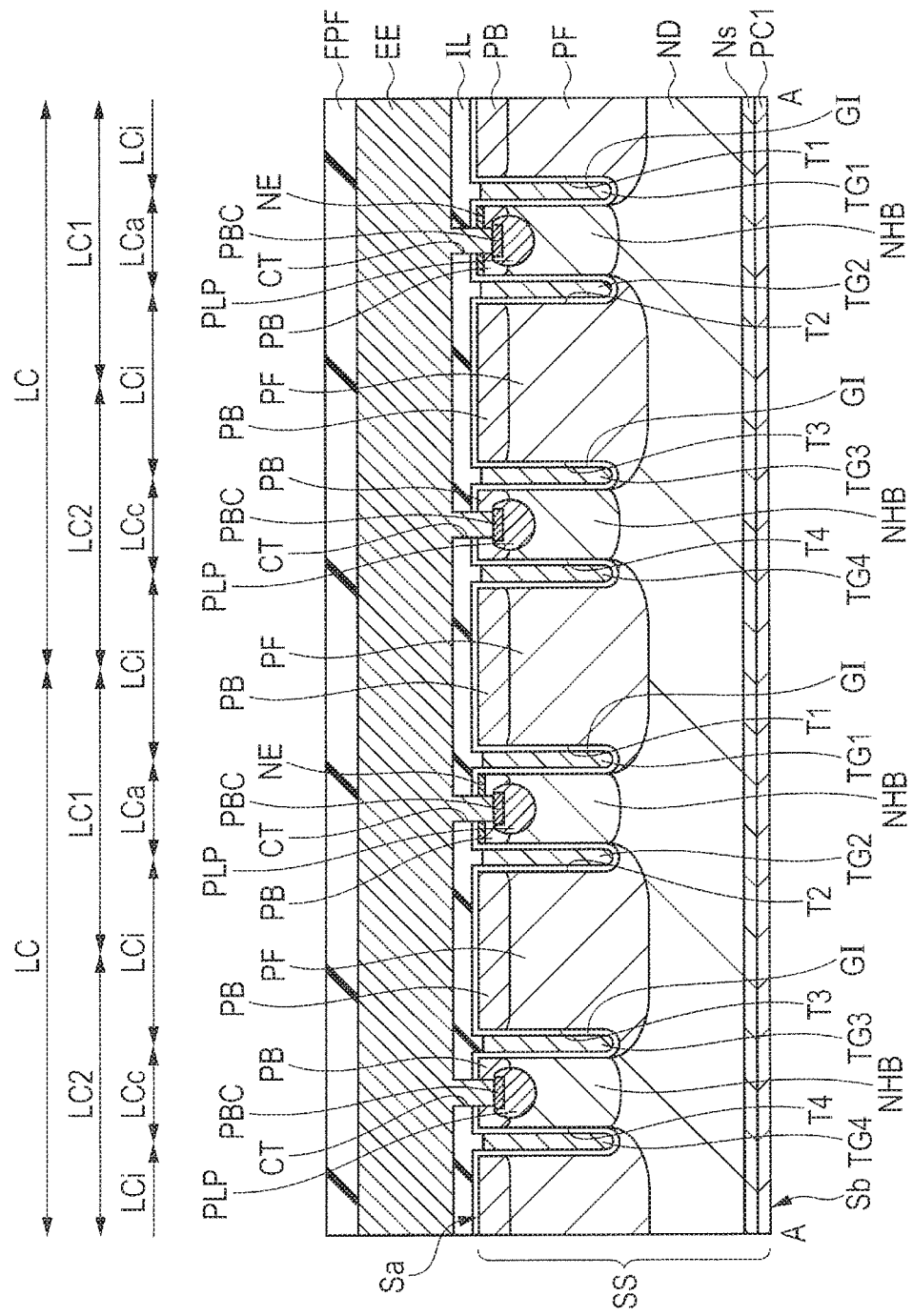
FIG. 19 is a fragmentary cross-sectional view of the trench gate IGBT during a manufacturing step following that of FIG. 18.

Next, as shown in FIG. 19, a $P^+$ type first collector region PC1 is formed, for example, by introducing a P type impurity into the entirety of the back surface Sb of the semiconductor substrate SS, for example, by ion implantation. Preferred examples of the condition employed for this ion implantation include the following condition: boron used as an ion species, a dose of about $7 \times 10^{12}/cm^2$, and implantation energy of about 40 KeV.

Figure 20:
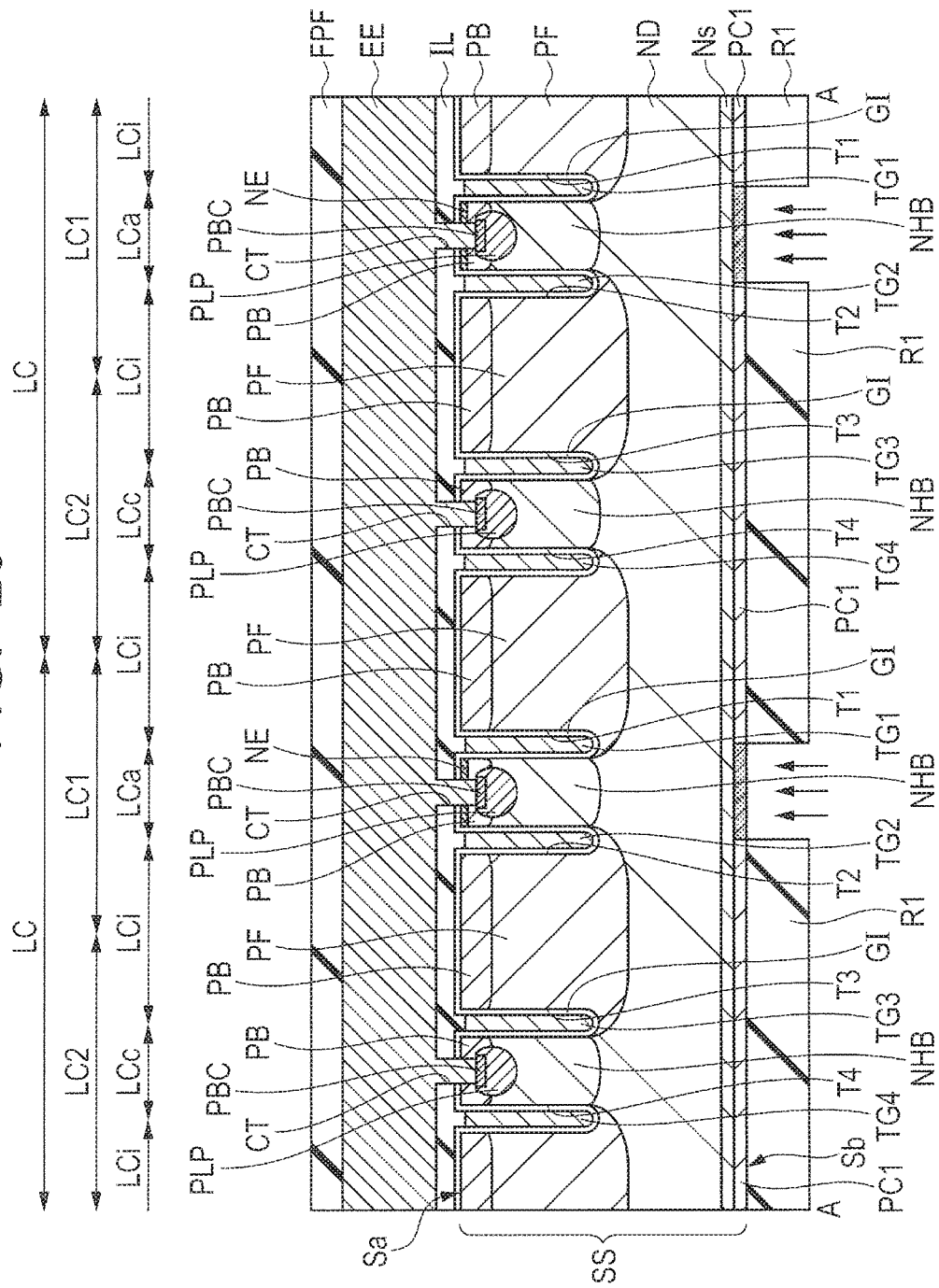
FIG. 20 is a fragmentary cross-sectional view of the trench gate IGBT during a manufacturing step following that of FIG. 19.

Next, as shown in FIG. 20, a resist mask R1 for introducing a $P^{++}$ type second collector region is faulted on the entirety of the back surface Sb of the semiconductor substrate SS by the method of application or the like, followed by ordinary lithography to pattern it. A P impurity is introduced into the back surface Sb of the semiconductor substrate SS, for example, by ion implantation with the patterned resist mask R1 as a mask to form a $P^{++}$ type second collector region PC2. Preferred examples of the condition employed for this ion implantation include the following condition: boron used as an ion species, a dose of about $5 \times 10^{13}/cm^2$, and implantation energy of about 40 KeV. The resist mask R1 that becomes unnecessary is then removed by ashing or the like. For activation of the impurity, the back surface Sb of the semiconductor substrate SS is subjected to laser annealing or the like if necessary. The $P^{++}$ type second collector region PC2 is famed in the linear active cell region LCa (refer to FIG. 6 or the like).

Figure 21:
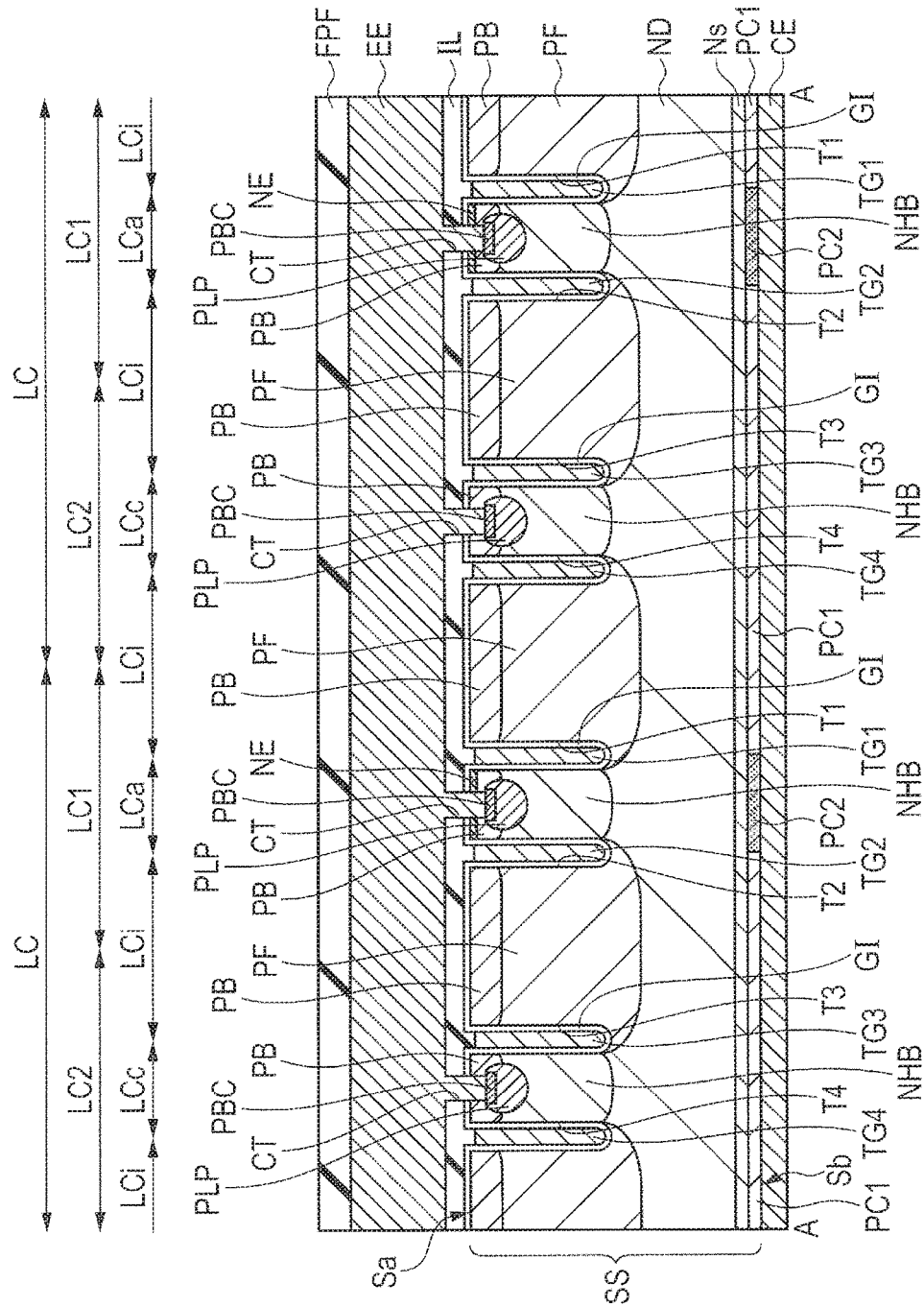
FIG. 21 is a fragmentary cross-sectional view of the trench gate IGBT during a manufacturing step following that of FIG. 20.

Next, as shown in FIG. 21, a collector electrode CE is formed on the entirety of the back surface Sb of the semiconductor substrate SS by stacking aluminum silicon (AlSi), titanium, nickel, and gold successively, for example, by sputtering. Then, the semiconductor substrate SS is divided into chip regions by dicing or the like, followed by sealing in a package as needed to form a semiconductor device having a trench gate IGBT.

Thus, in the trench gate IGBT of First Embodiment, the collector region formed on the back surface Sb side of the semiconductor substrate SS is comprised of a relatively lightly-doped $P^+$ type first collector region PC1 and a relatively heavily-doped $P^{++}$ type second collector region PC2. The $P^{++}$ type second collector region PC2 is provided in a region including, in plan view, the boundary between the first trench T1 having therein the first linear trench gate electrode TG1 and the $N^+$ type emitter region NE and the boundary between the second trench T2 having therein the second linear trench gate electrode TG2 and the $N^+$ type emitter region NE. This makes it possible to realize a semiconductor device equipped with a trench gate IGBT having a low ON voltage and high load short circuit withstand without deteriorating its switching off loss performance.

(Modification Example 1)

Figure 22:
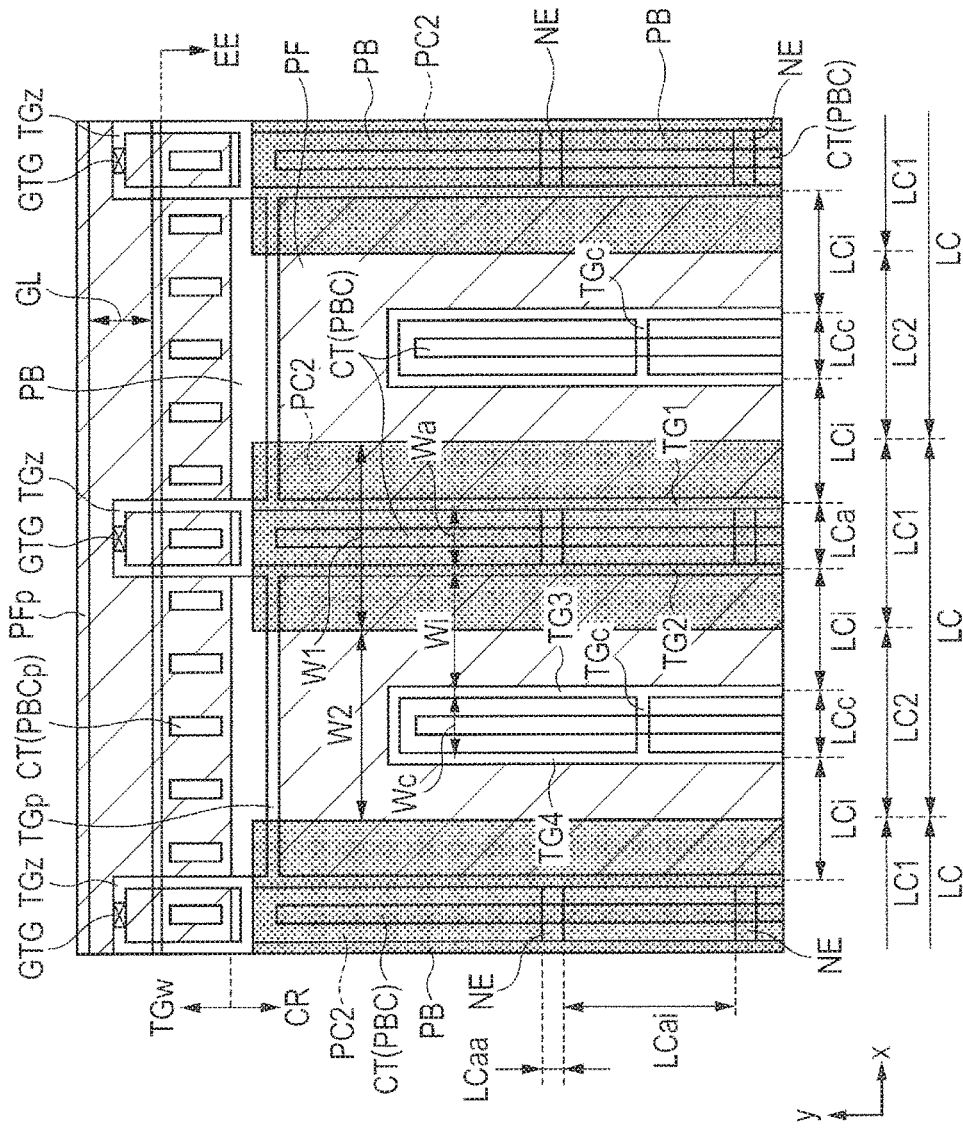
FIG. 22 is a partially enlarged fragmentary plan view showing an active portion of a semiconductor device according to Modification Example 1 of First Embodiment.

A semiconductor device having a trench gate IGBT according to Modification Example 1 of First Embodiment will be described referring to FIG. 22. FIG. 22 is a partially enlarged fragmentary plan view showing an active portion of the semiconductor device according to Modification Example 1 of First Embodiment and it is a plan view obtained by overlapping a $P^{++}$ type second collector region with FIG. 2. FIG. 22 shows the $P^{++}$ type second collector region shaded by hatching.

A difference from First Embodiment is the area of the $P^{++}$ type second collector region PC2. The $P^{++}$ type second collector region PC2 in First Embodiment is provided in the linear active cell region LCa.

However, in Modification Example 1, as shown in FIG. 22, the $P^{++}$ type second collector region PC2 is extended to the linear inactive cell region LCi. The $P^{++}$ type second collector region PC2 is provided, for example, in the first linear unit cell region LC1 comprised of the linear active cell region LCa which is at the center thereof and a pair of half-width linear inactive cell regions LCi surrounding the active cell region.

As shown above in FIG. 7, electrons supplied from the $N^+$ type emitter region NE flow through the channel and the electron accumulation layer and reach the back surface side Sb of the semiconductor substrate SS. Many of the electrons supplied from the surface Sa side of the semiconductor substrate SS therefore reach the collector electrode CE right below and around the interface between the first trench T1 having therein the first linear trench gate electrode TG1 and the N type hole barrier region NHB and right below and around the interface between the second trench T2 having therein the second linear trench gate electrode TG2 and the N type hole barrier region NHB. Some electrons, however, gradually diffuse, with a certain angle, in a normal line direction of the back surface Sb of the semiconductor substrate SS while they transfer in the $N^-$ type drift region ND.

In Modification Example 1, therefore, the $P^{++}$ type second collector region PC2 is made wider than that in First Embodiment in order to enhance effectiveness of offsetting the electrons supplied from the $N^+$ type emitter region NE with holes of the $P^{++}$ type second collector region PC2. The switching off loss performance is, however, presumed to become inferior to that of First Embodiment by making the $P^{++}$ type second collector region PC2 wider than that of First Embodiment.

(Modification Example 2)

Figure 23:
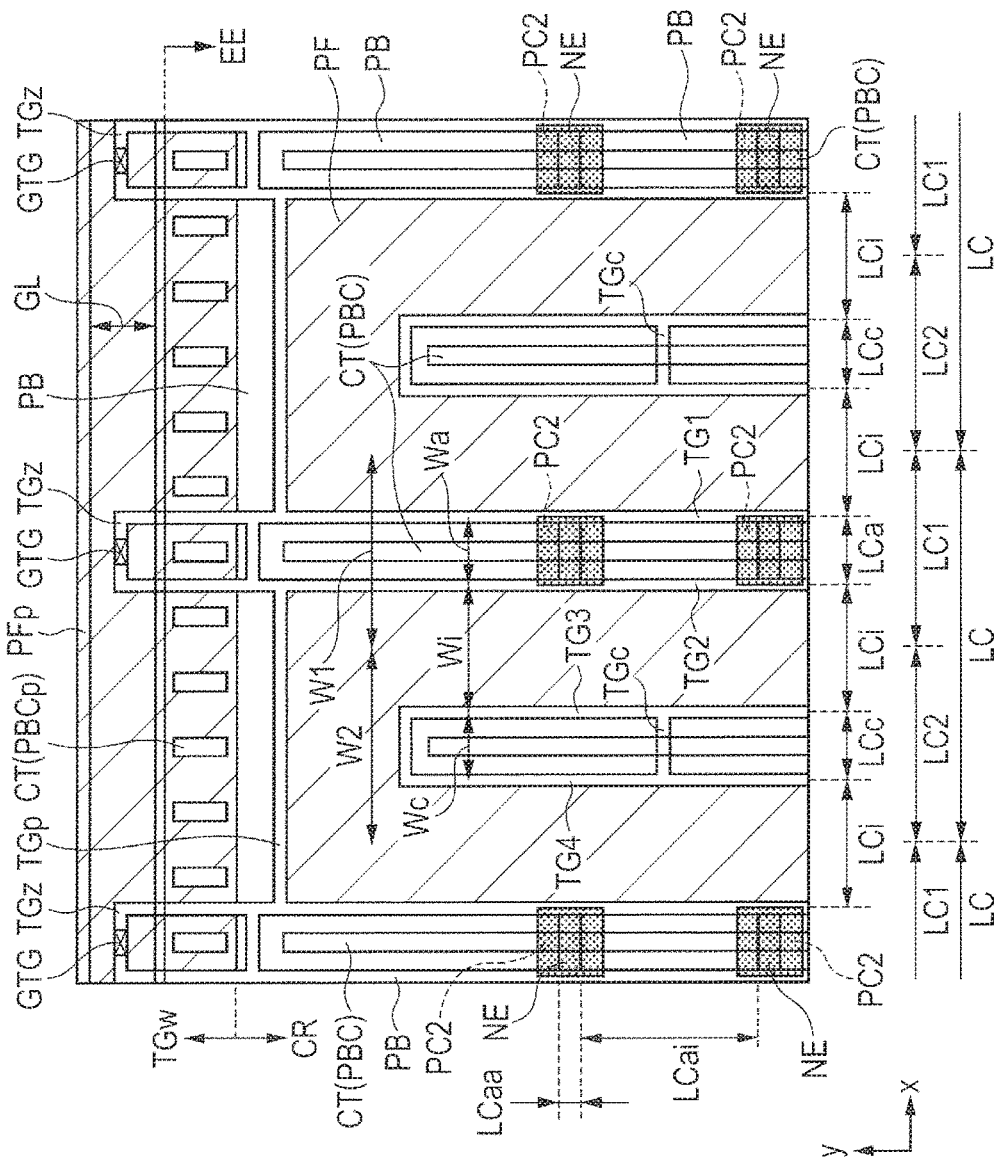
FIG. 23 is a partially enlarged fragmentary plan view showing an active portion of a semiconductor device according to Modification Example 2 of First Embodiment.

A semiconductor device having a trench gate IGBT according to Modification Example 2 of First Embodiment will be described referring to FIG. 23. FIG. 23 is a partially enlarged fragmentary plan view showing an active portion of the semiconductor device according to Modification Example 2 of First Embodiment and it is a plan view obtained by overlapping a $P^{++}$ type second collector region with FIG. 2. FIG. 23 shows the $P^{++}$ type second collector region shaded by hatching.

A difference from First Embodiment is the area of the $P^{++}$ type second collector region PC2. In First Embodiment, the $P^{++}$ type second collector region PC2 is provided in the linear active cell region LCa.

In Modification Example 2, however, as shown in FIG. 23, the $P^{++}$ type second collector region PC2 is provided, in plan view, only in the $N^+$ type emitter region NE and thereround.

As shown in FIG. 7, electrons supplied from the $N^+$ type emitter region NE flow through the channel and the electron accumulation layer and reach the back surface Sb side of the semiconductor substrate SS. Many of the electrons supplied from the surface Sa side of the semiconductor substrate SS therefore reach the collector electrode CE right below and around the interface between the first trench T1 having therein the first linear trench gate electrode TG1 and the N type hole barrier region NHB and right below and around the interface between the second trench T2 having therein the second linear trench gate electrode TG2 and the N type hole barrier region NHB.

In Modification Example 2, the $P^{++}$ type second collector region PC2 is therefore provided only in a region which many of electrons supplied from the $N^+$ type emitter region NE are presumed to reach. The resulting transistor is presumed to have improved switching off loss performance and, due to the Kirk effect, have reduced load short circuit withstand by making the $P^{++}$ type second collector region PC2 narrower than that of First Embodiment.

(Modification Example 3)

Figure 24A:
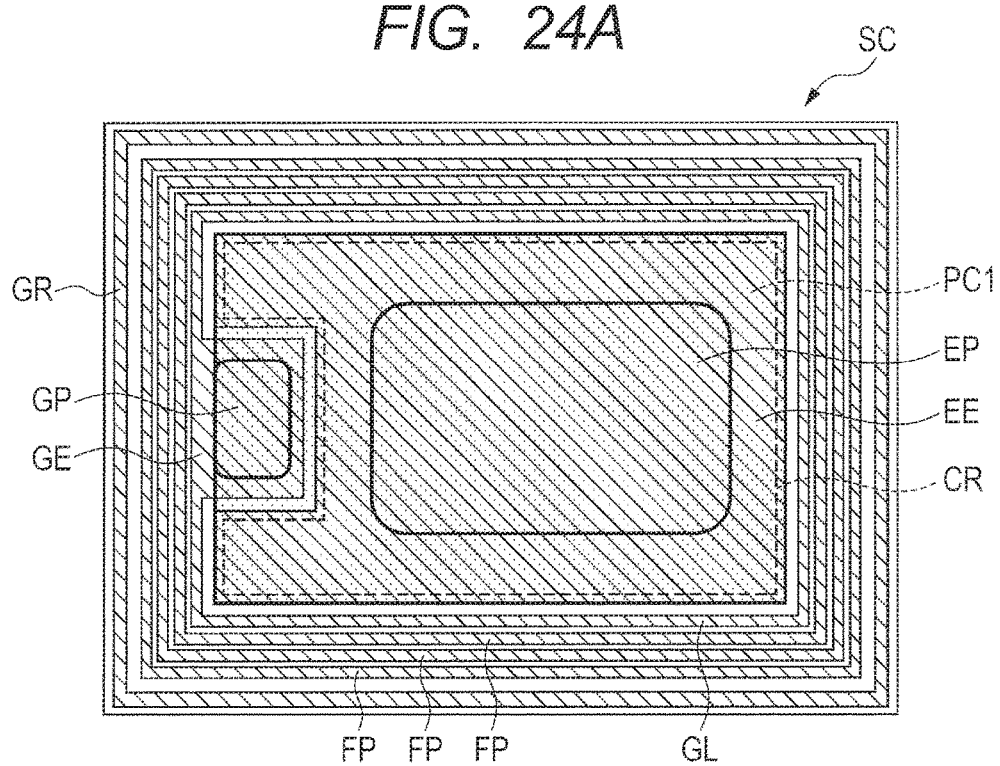
FIGS. 24A and 24B are surface-side and back-surface-side fragmentary plan views showing a semiconductor device according to Modification Example 3 of First Embodiment, respectively.
Figure 24B:
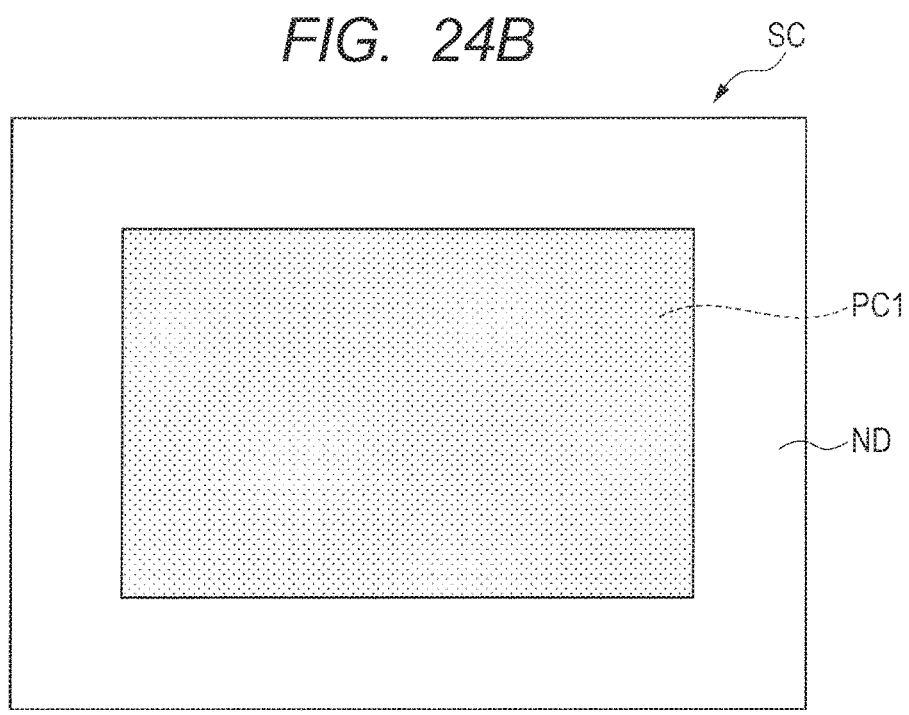
Figure 25:
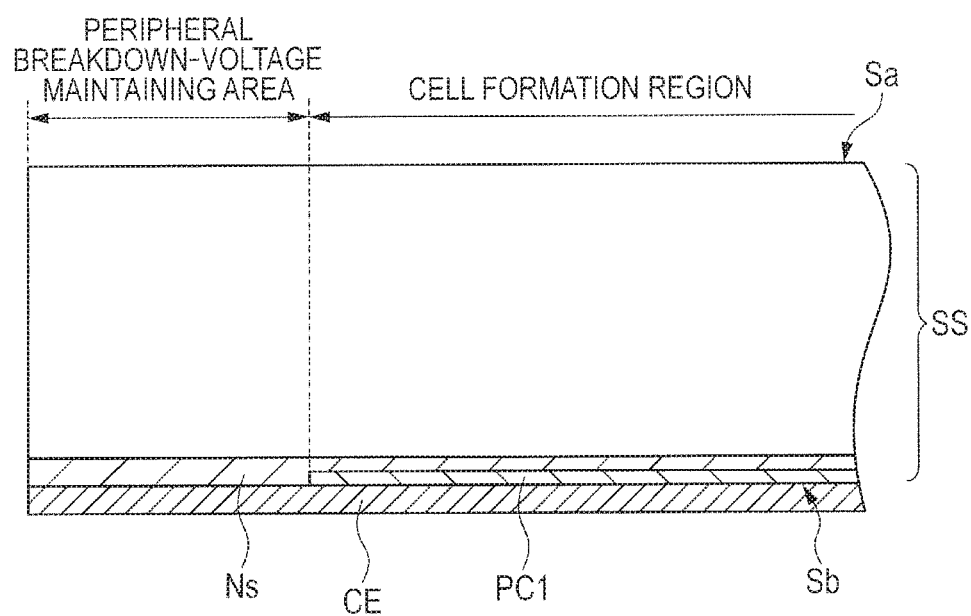
FIG. 25 is a partially enlarged schematic view of the fragmentary cross-section of the semiconductor device according to Modification Example 3 of First Embodiment.

A semiconductor device having a trench gate IGBT according to Modification Example 3 of First Embodiment will next be described referring to FIGS. 24A, 24B, and 25. FIGS. 24A and 24B are surface-side and back-surface-side fragmentary plan views of the semiconductor device according to Modification Example 3 of First Embodiment, respectively. FIG. 24A is a plan view obtained by overlapping a $P^+$ type first collector region with FIG. 1 and FIG. 24B is a plan view of a collector electrode viewed through from the back surface side of the semiconductor substrate. FIGS. 24A and 24B show the $P^+$ type first collector region shaded by hatching. FIG. 25 is a partially-enlarged fragmentary schematic cross-sectional view of the semiconductor device according to Modification Example 3 of First Embodiment.

Differences from First Embodiment are the area of the $P^+$ type first collector region PC1 and presence or absence of the $P^{++}$ type second collector region PC2. Described specifically, in First Embodiment, the semiconductor substrate SS has, on the entire surface on the back surface Sb thereof, the $P^+$ type first collector region PC1 and has, in the linear active cell region LCa, the $P^{++}$ type second collector region PC2.

In Modification Example 3, however, as shown in FIG. 24A, the $P^+$ type first collector region PC1 is formed in a region overlapping, in plan view, with the emitter electrode EE and the gate electrode GE without forming the $P^{++}$ type second collector region PC2. In other words, as shown in FIG. 25, the $P^+$ type first collector region PC1 is formed only on the back surface Sb side of the semiconductor substrate SS in the cell formation region and the $P^+$ type first collector region PC1 is not formed in the other region. As shown in FIG. 24B, therefore, the $P^+$ type first collector region PC1 is exposed from the back surface Sb of the semiconductor substrate SS in the cell formation region, while the N type field stop region Ns is exposed from the back surface Sb of the semiconductor substrate SS in a region other than the cell formation region.

As shown above in FIG. 7, electrons supplied from the $N^+$ type emitter region NE flow through the channel and the electron accumulation layer and reach the back surface Sb side of the semiconductor substrate SS. Electrons supplied from the surface Sa side of the semiconductor substrate SS therefore reach the collector electrode CE in the cell formation region. Electrons are, on the other hand, not supplied from the peripheral portion of the semiconductor chip SC so that there is no need of unnecessarily forming a PNP structure on the back surface Sb of the semiconductor substrate SS and thereby leaving a fear of latch-up.

In Modification Example 3, therefore, the $P^+$ type first collector region PC1 is provided only on the back surface Sb side of the semiconductor substrate SS in the cell formation region. However, the transistor thus obtained is presumed to become inferior in switching off loss performance to that of First Embodiment. When the concentration in the $P^+$ type first collector region PC1 is low, the load short circuit withstand may decrease due to the Kirk effect so that in Modification Example 3, the concentration in the $P^+$ type first collector region PC1 may be made higher than that in First Embodiment.

(Modification Example 4)

Figure 26:
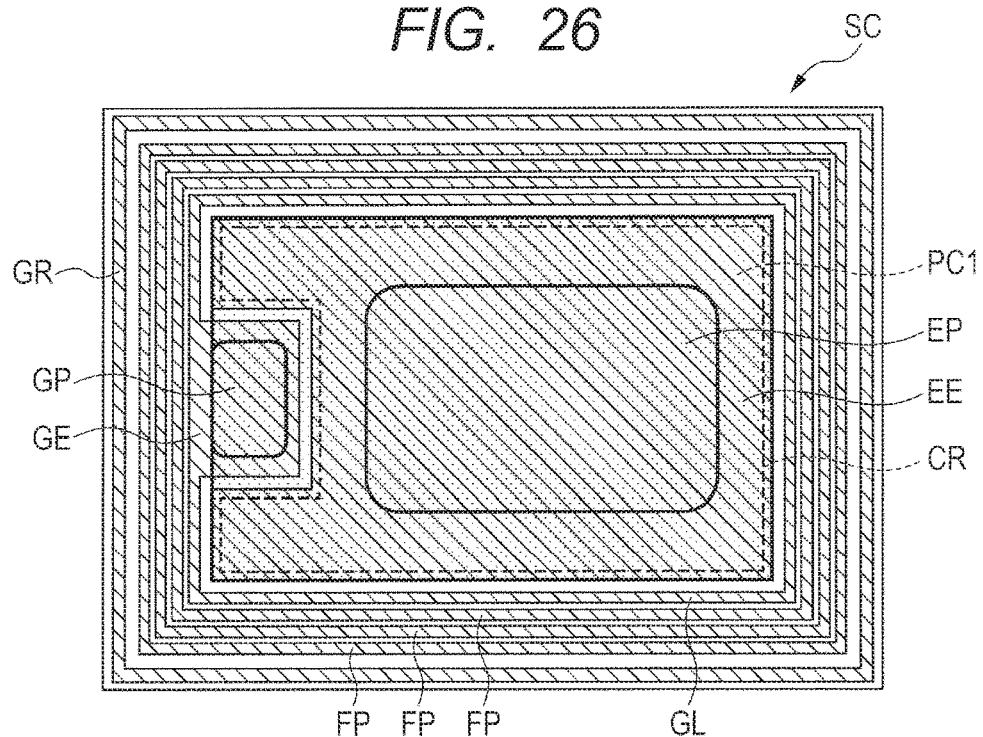
FIG. 26 is a surface-side fragmentary plan view showing a semiconductor device according to Modification Example 4 of First Embodiment.
Figure 27:
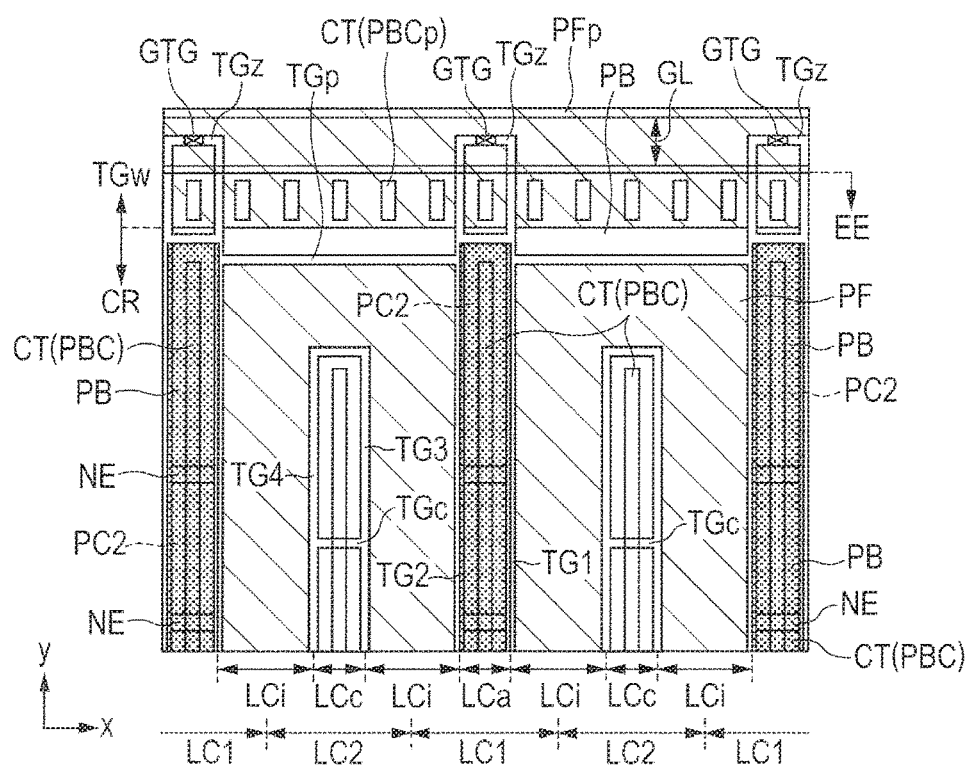
FIG. 27 is a partially enlarged fragmentary plan view showing an active portion of the semiconductor device according to Modification Example 4 of First Embodiment.

A semiconductor device having a trench gate IGBT according to Modification Example 4 of First Embodiment will next be described referring to FIGS. 26 and 27. FIG. 26 is a surface-side fragmentary plan view showing the semiconductor device according to Modification Example 4 of First Embodiment and it is a plan view obtained by overlapping the $P^+$ type first collector region with FIG. 1. In FIG. 26, the $P^+$ type first collector region is shaded by hatching. FIG. 27 is a partially enlarged fragmentary plan view of an active portion of the semiconductor device according to Modification Example 4 of First Embodiment and it is a plan view obtained by overlapping the $P^{++}$ type second collector region with FIG. 2. In FIG. 27, the $P^{++}$ type second collector region is shaded by hatching.

A difference from First Embodiment is the area of the $P^+$ type first collector region PC1. Described specifically, in First Embodiment, the semiconductor substrate SS has, on the entire surface on the back surface Sb side thereof, the $P^+$ type first collector region PC1 and has, in the linear active cell region LCa, the $P^{++}$ type second collector region PC2.

In Modification Example 4, however, as shown in FIG. 26, the $P^+$ type first collector region PC1 is formed in a region overlapping, in plan view, with the emitter electrode EE and the gate electrode GE. As shown in FIG. 27, on the other hand, the $P^{++}$ type second collector region PC2 is provided in the linear active cell region LCa similarly to First Embodiment. This means that the $P^+$ type first collector region PC1 is exposed from the back surface Sb of the semiconductor substrate SS in the cell formation region and the N type field stop region Ns is exposed from the back surface Sb of the semiconductor substrate SS in a region other than the cell formation region as in FIG. 24B, but a plurality of the $P^{++}$ type second collector regions PC2 is exposed in the $P^+$ type first collector region PC1.

As shown above in FIG. 7, electrons supplied from the $N^+$ type emitter region NE flow through the channel and the electron accumulation layer and reach the back surface Sb side of the semiconductor substrate SS. Electrons supplied from the surface Sa side of the semiconductor substrate SS therefore reach the collector electrode CE in the cell formation region. On the other hand, no electrons are supplied from the peripheral portion of the semiconductor chip SC so that there is no need of unnecessarily forming a PNP structure on the back surface Sb of the semiconductor substrate SS and thereby leaving a fear of latch-up.

In Modification Example 4, the P$^+$ type first collector region PC1 and the P$^{++}$ type second collector region PC2 are therefore provided only on the back surface Sb side of the semiconductor substrate SS in the cell formation region.

(Second Embodiment)

Figure 28:
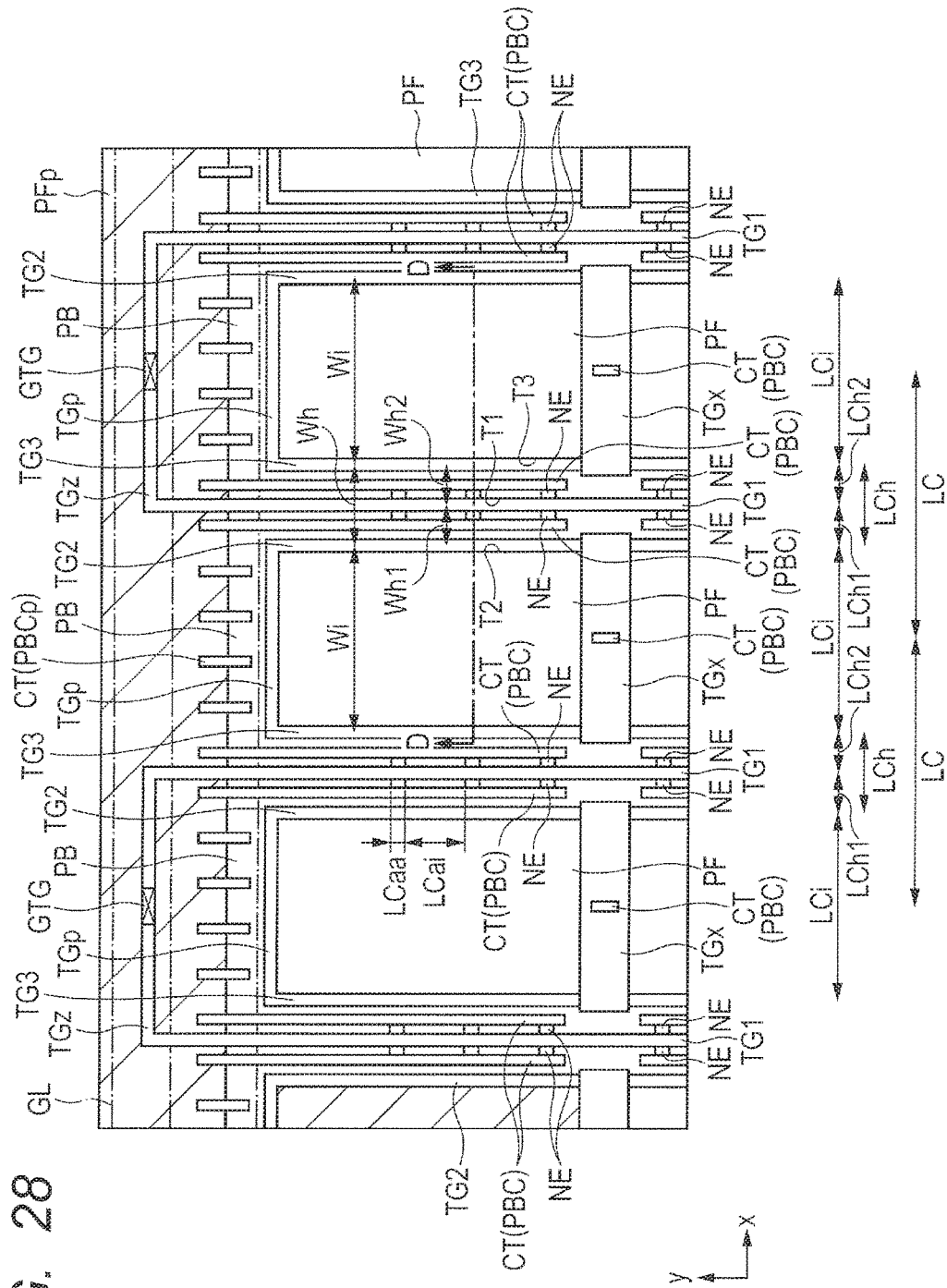
FIG. 28 is a partially enlarged fragmentary plan view showing an active portion of a semiconductor device according to Second Embodiment.
Figure 29:
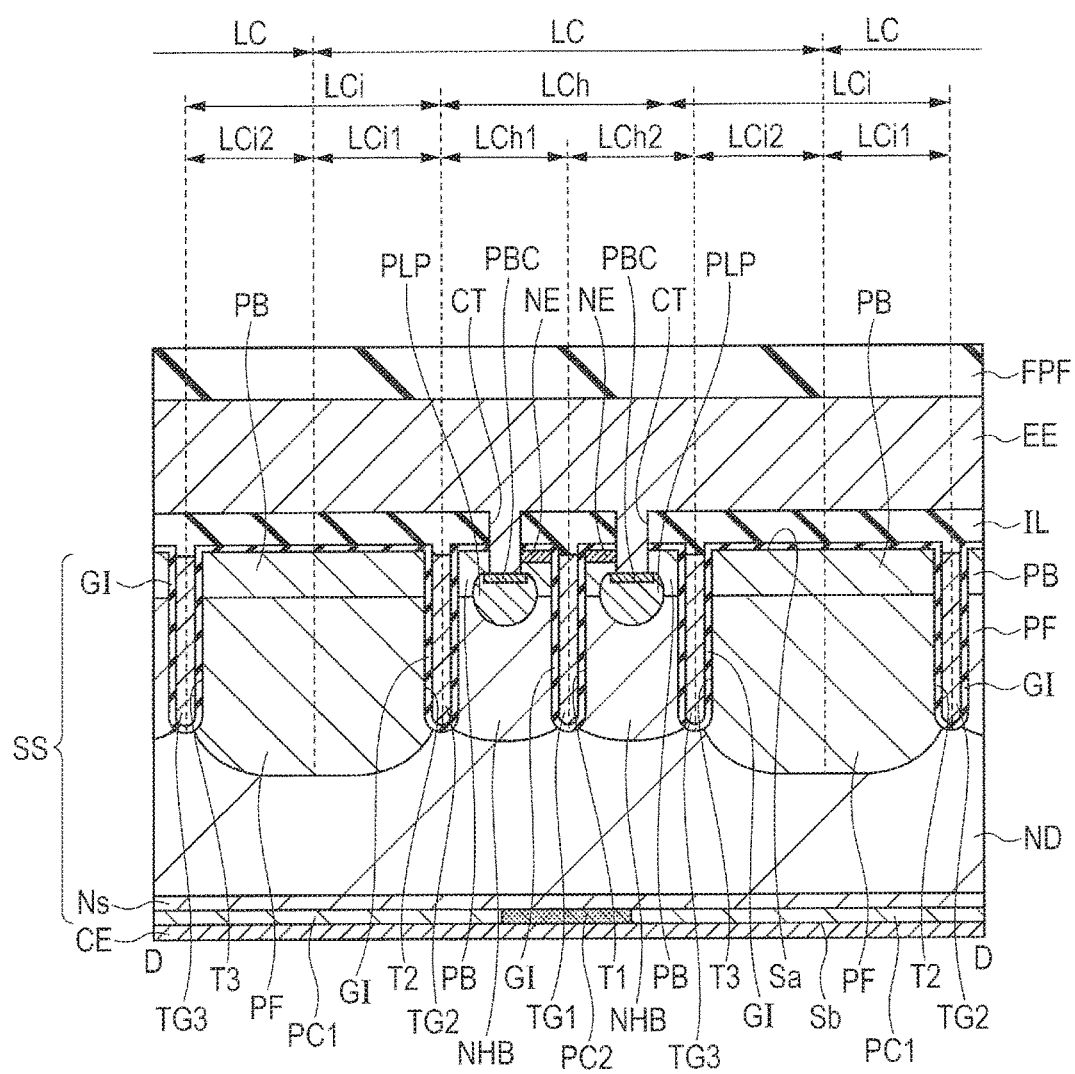
FIG. 29 is a fragmentary cross-sectional view taken along the line D-D shown in FIG. 28.

A trench gate IGBT according to Second Embodiment will next be described referring to FIGS. 28 and 29. FIG. 28 is a partially enlarged fragmentary plan view of an active region of a semiconductor device according to Second Embodiment. FIG. 29 is a fragmentary cross-sectional view taken along the line D-D shown in FIG. 28.

The trench gate IGBT described herein is a so-called EGE type trench gate IGBT in which three trench gate electrodes are arranged with a space between any two of them, the trench gate electrode at the center of them is electrically coupled to a gate electrode, and two trench gate electrodes arranged at both ends are electrically coupled to an emitter electrode. The trench gate IGBT of the present embodiment is different from that of First Embodiment in the respective structures of a linear active cell region LCa, a linear inactive cell region LCi, and a linear hole collector cell region LCc. In the following description, only a portion different from the trench gate IGBT of First Embodiment will be described in principle.

As shown in FIG. 28, a linear unit cell region LC according to Second Embodiment is comprised of a linear hybrid cell region LCh and half-width linear inactive cell regions LCi on both sides thereof. The width Wh of the linear hybrid cell region LCh is narrower than the width Wi of the linear inactive cell region LCi.

The linear hybrid cell region LCh is comprised of a first linear hybrid sub-cell region LCh1 and a second linear hybrid sub-cell region LCh2 which are plane symmetrical to each other. The first linear hybrid sub-cell region LCh1 is a hybrid cell obtained by integrating a right half cell of the linear active cell region LCa with a left half cell of the linear hole collector cell region LCc, each shown above in FIG. 2. On the other hand, the second linear hybrid sub-cell region LCh2 is a hybrid cell obtained by integrating a left half cell of the linear active cell region LCa with a right half cell of the linear hole collector cell region LCc, each shown above in FIG. 2.

In other words, the linear hybrid cell region LCh is a combination of the first linear hybrid sub-cell region LCh1 and the second linear hybrid sub-cell region LCh2 famed so as to have a first linear trench gate electrode TG1 electrically coupled to the gate electrode (gate electrode GE shown above in FIG. 1) at the center. In Second Embodiment, therefore, the width Wh1 of the first linear hybrid sub-cell region LCh1 is equal or substantially equal to the width Wh2 of the second linear hybrid sub-cell region LCh2.

A second linear trench gate electrode TG2 and a third linear trench gate electrode TG3 to be electrically coupled to an emitter electrode EE are placed on two respective sides having therebetween the linear inactive cell region LCi. Intercoupling is therefore achieved by providing, in addition to an end trench gate electrode TGp, a coupling gate lead pad (emitter coupling portion) TGx made of a polycrystalline film which is of the same layer as the second linear trench gate electrode TG2 and the third linear trench gate electrode TG3. A contact trench CT that electrically couples the second linear trench gate electrode TG2 and the third linear trench gate electrode TG3 to the emitter electrode EE is planarly included in the coupling gate lead pad (emitter coupling portion) TGx. Such a structure enables further improvement in coupling reliability.

Next, the cross-sectional structure taken along the line D-D of FIG. 28 will next be described referring to FIG. 29.

As shown in FIG. 29, an N$^-$ type drift region ND occupies the main portion of the semiconductor substrate SS and the semiconductor substrate SS has, on the back surface Sb side thereof, an N type field stop region Ns contiguous to the N$^-$ type drift region ND. The N type field stop region Ns has an impurity concentration of, for example, from about $1\times10^{15}$ to $1\times10^{17}/cm^3$.

Further, the N type field stop region Ns has, on the side opposite to the N type drift region ND, a P$^+$ type first collector region PC1 and a P$^{++}$ type second collector region PC2 which are contiguous to the N type field stop region Ns. The P$^{++}$ type second collector region PC2 is provided in a half width of the first linear hybrid sub-cell region LCh1 and a half width of the second linear hybrid cell region LCh2, between which lies the first trench T1 having therein the first linear trench gate electrode TG1. The impurity concentration of the P$^{++}$ type second collector region PC2 is higher than that of the P$^+$ type first collector region PC1. The P$^+$ type first collector region PC1 has an impurity concentration of, for example, from about $1\times10^{16}$ to $1\times10^{17}/cm^3$ and the P$^{++}$ type second collector region PC2 has an impurity concentration of, for example, from about $1\times10^{17}$ to $1\times10^{18}/cm^3$.

Further, the semiconductor substrate SS has, on the back surface Sb thereof, a collector electrode CE to be electrically coupled to the P$^+$ type first collector region PC1 and the P$^{++}$ type second collector region PC2.

The semiconductor substrate SS has, on almost the entirety of the surface Sa side thereof (almost the entire surface in the cell formation region CR), a P type body region PB.

The semiconductor substrate SS has, on the surface Sa side thereof at a boundary between the first linear hybrid sub-cell region LCh1 and the second linear hybrid sub-cell region LCh2, a first trench T1. It has, inside thereof, the first linear trench gate electrode TG1 via a gate insulating film GI.

The first linear trench gate electrode TG1 has electrical coupling to a gate electrode (the gate electrode GE shown above in FIG. 1). In the first trench T1 formed in the semiconductor substrate SS, the first linear trench gate electrode TG1 extends from the lower end portion to the upper portion of the trench.

On the other hand, the semiconductor substrate SS has, on the surface Sa side at a boundary between the linear hybrid cell region LCh and the linear inactive cell region LCi, a second trench T2 and a third trench T3. They have, inside thereof, the second linear trench gate electrode TG2 and the third linear trench gate electrode TG3 via the gate insulating film GI, respectively.

The second linear trench gate electrode TG2 and the third linear trench gate electrode TG3 each have electrical coupling to the emitter electrode EE. In the second trench T2 famed in the semiconductor substrate SS, the second linear trench gate electrode TG2 extends from the lower end portion to the upper portion of the trench. Similarly, in the third trench T3 formed in the semiconductor substrate SS, the third linear trench gate electrode TG3 extends from the lower end portion to the upper portion of the trench.

In the first linear hybrid sub-cell region LCh1 and the second linear hybrid sub-cell region LCh2, the semiconductor substrate SS has, on the surface Sa side thereof and only on the side of the first linear trench gate electrode TG1, an N+ type emitter region NE and the contact trench CT has, at the lower end portion thereof, a type body contact region PBC. This P+ type body contact region PBC has therebelow a P+ type latch-up prevention region PLP. The P+ type latch-up prevention region PLP has therebelow an N type hole barrier region NHB.

In the linear inactive cell region LCi, the semiconductor substrate SS has, on the surface Sa side thereof, a P type floating region PF deeper than, for example, the first, second, and third trenches T1, T2, and T3 below the P type body region PB.

The semiconductor substrate SS has, on almost the entirety of the surface Sa, an interlayer insulating film IL made of, for example, silicon oxide. The interlayer insulating film IL has, thereon, an emitter electrode EE made of a metal film having, for example, aluminum as a main component thereof. It has coupling to the N+ type emitter region NE and the P+ type body contact region PBC via the contact trench CT.

The emitter electrode 3E further has thereon a final passivation film FPF made of, for example, a polyimide-based organic insulating film.

As described above in First Embodiment (refer to FIG. 7), when a positive voltage is applied to the first linear trench gate electrode TG1 electrically coupled to the gate electrode, a channel (inversion layer) is formed in the P type body region PB on the side surface of the first trench T1 having therein the first linear trench gate electrode TG1 and the channel extends in the depth direction (the back surface Sb direction of the semiconductor substrate SS). Further, an accumulation layer is formed in the N type hole barrier region HHB on the side surface of the first trench T1 and it extends in the depth direction (the back-surface Sb direction of the semiconductor substrate SS). Electrons supplied from the N+ type emitter region NE flow through the channel and electron accumulation layer and reach the back surface Sb side of the semiconductor substrate SS. Electrons supplied from the surface Sa side of the semiconductor substrate SS are likely to reach the collector electrode CE right below and around the interface between the first trench T1 and the N type hole barrier region NHB.

In Second Embodiment, therefore, a P++ type second collector region PC2 is provided in the back surface Sb side region of the semiconductor substrate SS including a region right below the interface between the first trench T1 having therein the first linear trench gate electrode TG1 and the N type ball barrier region NHB. In other words, a P++ type second collector region PC2 is provided so as to include, in plan view, the interface between the first trench T1 having therein the first linear trench gate electrode TG1 and the N+ type emitter region NE. This enables the present embodiment to produce an advantage almost similar to that of First Embodiment and makes it possible to achieve a semiconductor device equipped with a trench gate IGBT having a low ON voltage and high load short circuit withstand without deteriorating its switching-off loss performance.

The invention made by the present inventors has been described specifically based on some embodiments. It is needless to say that the invention is not limited to or by these embodiments but can be changed in various ways without departing from the gist of the invention.

What is claimed is:

1. A method of manufacturing a semiconductor device, comprising the steps of:
   (a) providing a semiconductor substrate of a first conductivity type having a first main surface and a second main surface on a side opposite to a side of the first main surface;
   (b) forming a first trench and a second trench each having a first depth from the first main surface of the semiconductor substrate, the first and second trenches spaced apart from each other;
   (c) forming, in the first trench, a first trench gate electrode having a first conductive film via a first gate insulating film having a first insulating film, and forming, in the second trench, a second trench gate electrode having the first conductive film via a second gate insulating film having the first insulating film;
   (d) forming a first semiconductor region of a second conductivity type different from the first conductivity type, the first semiconductor region having, from the first main surface of the semiconductor substrate, a second depth smaller than the first depth;
   (e) forming, in the first semiconductor region, a second semiconductor region of the first conductivity type, the second semiconductor region having, from the first main surface of the semiconductor substrate, a third depth smaller than the second depth so as to be contiguous to a first side surface of the first trench;
   (f) forming an interlayer insulating film over the first main surface of the semiconductor substrate, and then forming, over the interlayer insulating film, a first electrode to be electrically coupled to the first trench gate electrode and the second trench gate electrode, and a second electrode to be electrically coupled to the first semiconductor region and the second semiconductor region;
   (g) grinding the semiconductor substrate from the side of the second main surface;
   (h) forming a third semiconductor region on the side of the second main surface by ion implantation of an impurity of the second conductivity type into the second main surface of the semiconductor substrate;
   (i) forming a resist film over the second main surface of the semiconductor substrate and then patterning the resist film;
   (j) forming a fourth semiconductor region on the side of the second main surface by ion implantation of an impurity of the second conductivity type into the second main surface of the semiconductor substrate, with the patterned resist film as a mask; and
   (k) forming a third electrode that electrically couples the third semiconductor region to the fourth semiconductor region over the second main surface of the semiconductor substrate, wherein the fourth semiconductor region is formed in a region including, in plan view, an interface between the first trench and the second semiconductor region, and wherein the first conductivity type is N-type and the second conductivity type is P-type.

2. The method of manufacturing a semiconductor device according to claim 1,
   wherein the fourth semiconductor region is formed in a region overlapping, in plan view, the second semiconductor region.

3. The method of manufacturing a semiconductor device according to claim 1,
   wherein the third semiconductor region has an impurity concentration of from $1 \times 10^{16}$ to $1 \times 10^{17}/cm^3$ and the fourth semiconductor region has an impurity concentration of from $1 \times 10^{17}$ to $1 \times 10^{18}/cm^3$.

4. The method of manufacturing a semiconductor device according to claim 1,
   wherein by grinding in the step (g), the thickness of the semiconductor substrate is reduced to 30 to 200 µm.

* * * * *